(12) United States Patent
Jain et al.

(10) Patent No.: US 11,416,049 B2
(45) Date of Patent: Aug. 16, 2022

(54) IN-FIELD MONITORING OF ON-CHIP THERMAL, POWER DISTRIBUTION NETWORK, AND POWER GRID RELIABILITY

(71) Applicant: QUALCOMM Incorporated, San Diego, CA (US)

(72) Inventors: Palkesh Jain, Bangalore (IN); Rahul Gulati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 297 days.

(21) Appl. No.: 16/826,729

(22) Filed: Mar. 23, 2020

(65) Prior Publication Data
US 2021/0294398 A1   Sep. 23, 2021

(51) Int. Cl.
*G01R 31/317* (2006.01)
*G06F 1/20* (2006.01)
*G06F 1/3203* (2019.01)

(52) U.S. Cl.
CPC ....... *G06F 1/206* (2013.01); *G01R 31/31702* (2013.01); *G06F 1/3203* (2013.01)

(58) Field of Classification Search
None
See application file for complete search history.

(56) References Cited

U.S. PATENT DOCUMENTS

| | | | |
|---|---|---|---|
| 10,012,691 B1 * | 7/2018 | Zhou | G01R 31/2856 |
| 2006/0190785 A1 | 8/2006 | Pilling | |
| 2014/0195196 A1 | 7/2014 | Charlebois et al. | |
| 2019/0250209 A1 | 8/2019 | Lee et al. | |
| 2020/0019477 A1 * | 1/2020 | Jain | G01R 31/31703 |

FOREIGN PATENT DOCUMENTS

KR   20160047126 A   5/2016

OTHER PUBLICATIONS

International Search Report and Written Opinion—PCT/US2021/023218—ISA/EPO—Jun. 17, 2021, 22 pages.

* cited by examiner

*Primary Examiner* — Jermele M Hollington
(74) *Attorney, Agent, or Firm* — The Marbury Law Group/Qualcomm

(57) ABSTRACT

Various embodiments may include methods and systems for monitoring characteristics of a system-on-a-chip. Various embodiments may include inputting, from a test data input connection, test data to a first scan chain section including a first group of logic gates located within a first region of the SoC. Various embodiments may include providing, from a first clock gate associated with the first region of the SoC, a clock signal to the first group of logic gates. Various embodiments may include measuring, using a first sensor, the characteristics at a second region of the SoC in response to providing the clock signal to the first group of logic gates. Embodiments may further include processing or analyzing measured characteristics to determine a testing result.

30 Claims, 12 Drawing Sheets

IN-FIELD MONITORING OF ON-CHIP THERMAL, POWER DISTRIBUTION NETWORK, AND POWER GRID RELIABILITY

BACKGROUND

System-on-a-chip (SoC) designs and devices are becoming more complex, implementing smaller physical profiles with ever-decreasing conductor path dimensions for transferring data at higher rates than predecessor SoCs. Operating at higher speeds with greater physical design constraints may increase power demands, which can increase the temperatures an SoC is subjected to during operation. Higher temperatures during testing, bootup, and normal operation can increase the risk of initialization and run-time errors within an SoC. These errors, and other errors such as those introduced in a malicious attack, may occur at higher rates when circuitry in an SoC ages or the power grid is inefficient or faulty.

SUMMARY

Various aspects include methods and circuits for monitoring in-field characteristics of a system-on-a-chip (SoC). Various aspects may include inputting, from a test data input connection, test data to a first scan chain section including a first group of logic gates located within a first region of the SoC, providing, from a first clock gate associated with the first region of the SoC, a clock signal to the first group of logic gates, and measuring, using a first sensor, the characteristics at a second region of the SoC in response to providing the clock signal to the first group of logic gates.

Some aspects may include configuring, via a clock gate controller, the first clock gate to provide the clock signal to the first group of logic gates, and configuring, via the clock gate controller, a second clock gate associated with the second region of the SoC to gate the clock signal from a second group of logic gates in response to configuring the first clock gate to provide the clock signal to the first group of logic gates, wherein a second scan chain section includes the second group of logic gates located within the second region of the SoC. Various aspects may further include inputting, from the test data input connection, the test data to the second scan chain section, configuring, via the clock gate controller, the second clock gate to provide the clock signal to the second group of logic gates, and configuring, via the clock gate controller, the first clock gate to gate the clock signal from the first group of logic gates in response to configuring the second clock gate to provide the clock signal to the second group of logic gates. Various aspects may further include providing, from the second clock gate, the clock signal to the second group of logic gates, and measuring, using a second sensor, the characteristics at the first region of the SoC in response to providing the clock signal to the second group of logic gates.

In some aspects, the in-field characteristics may include thermal characteristics, voltage drop, and power grid characteristics. In some aspects, the clock gate controller may be provided with a high-speed clock or a turbo-shifted clock.

Some aspects may further include generating the test data from a pattern generator, in which inputting the test data to the first group of logic gates and the second group of logic gates may further include serially shifting the test data into the first group of logic gates and the second group of logic gates.

In some aspects, the first region and the second region may be logically arranged in a grid configuration with a plurality of scan chain sections corresponding to a plurality of regions of the SoC.

In some aspects, the first sensor and second sensor may be temperature sensors and the characteristics may be temperatures of the respective region. In some aspects, the first sensor and second sensor may be voltage sensors and the characteristics may be voltages in the respective region.

Some aspects may include comparing the characteristics measurements by the first and second sensors to a threshold corresponding to the respective region, identifying an error in the SoC in response to a measured characteristic exceeding the threshold, wherein the error is an indication of an aged power delivery network, an on-chip or off-chip power attack, or a hard-error, and implementing a remedial action in response to identifying the error.

Some aspects may include generating, by a pattern generator coupled to the test data input connection, the test data input to the first and second scan chain sections. In some aspects, logic gates of the first group of logic gates may be serially connected, logic gates of the second group of logic gates may be serially connected, and the inputting the test data into the first and second scan chain sections may further comprise serially shifting the test data through the first and second groups of logic gates.

In some aspects, the first region and the second region may be logically arranged in a grid configuration with a plurality of scan chain sections corresponding to a plurality of regions of the SoC.

Further aspects include a non-transitory processor-readable storage medium having stored thereon processor-executable software instructions configured to cause a processor to perform operations of any of the methods summarized above. Further aspects include a system-on-a-chip (SoC) having means for performing functions of any of the methods summarized above.

Further aspects include a system-on-a-chip configured to implement any of the methods summarized above. The SoC may include a first scan chain section, which may include a first group of logic gates located within a first region of the SoC, and a first clock gate configurable to provide a clock signal to the first group of logic gates. In some aspects, the first clock gate may be associated with the first region. The SoC may further include a test data input connection configured to input test data to the first scan chain section, and a first sensor configured to measure the characteristics at a second region of the SoC.

Some aspects of the SoC may further include a second scan chain section which may a second group of logic gates located within the second region of the SoC, and a second clock gate configurable to provide the clock signal to the second group of logic gates. In some aspects, the second clock gate may be associated with the second region. The SoC may further include a second sensor configured to measure the characteristics at the first region of the SoC, and a clock gate controller configured to control the first clock gate to provide the clock signal to the first group of logic gates while controlling the second clock gate to gate the clock signal from the second group of logic gates, and to control the second clock gate to provide the clock signal to the second group of logic gates while controlling the first clock gate to gate the clock signal from the first group of logic gates. In some aspects, the test data input connection may be configured to input the test data to the second scan chain section, the first sensor may be configured to measure the characteristics at the second region in response to the clock signal provided to the first group of logic gates, and the second sensor may be configured to measure the characteristics at the first region in response to the clock signal provided to the second group of logic gates.

In some aspects, the SoC may be further configured to compare characteristics measurements by the first and second sensors to a threshold corresponding to the respective region, identify an error in the SoC in response to a measured characteristic exceeding the threshold, and implement a remedial action in response to identifying the error. In some aspects, the error may be an indication of an aged power delivery network, an on-chip or off-chip power attack, or a hard-error.

Some aspects of the SoC may further include a pattern generator coupled to the test data input connection and configured to generate the test data input to the first and second scan chain sections.

In some aspects, logic gates of the first group of logic gates may be serially connected, and logic gates of the second group of logic gates may be serially connected. In some aspects, the test data may be input into the first and second scan chain sections by serially shifting the test data through the first and second groups of logic gates.

BRIEF DESCRIPTION OF THE DRAWINGS

The accompanying drawings, which are incorporated herein and constitute part of this specification, illustrate exemplary embodiments, and together with the general description given above and the detailed description given below, serve to explain the features of the various embodiments.

DETAILED DESCRIPTION

Figure 1:
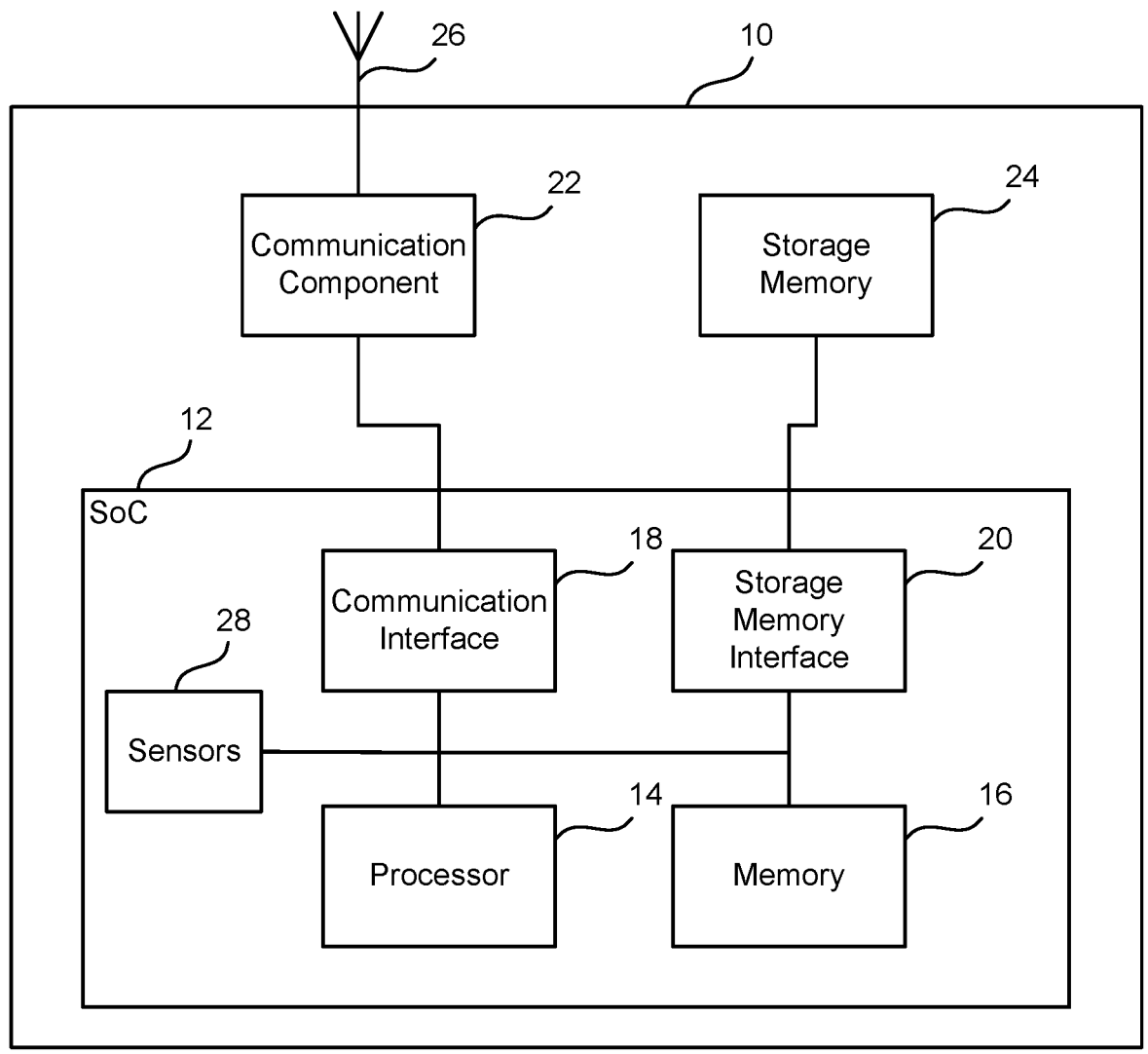
FIG. 1 illustrates a system including a computing device suitable for implementing various embodiments.

Various aspects will be described in detail with reference to the accompanying drawings. Wherever possible, the same reference numbers will be used throughout the drawings to refer to the same or like parts. References made to particular examples and embodiments are for illustrative purposes and are not intended to limit the scope of the various aspects or the claims.

The term "system-on-a-chip" (SoC) is used herein to refer to a set of interconnected electronic circuits typically, but not exclusively, including a processing device, a memory, and a communication interface. A processing device may include a variety of different types of processors 14 and processor cores, such as a general purpose processor, a central processing unit (CPU), a digital signal processor (DSP), a graphics processing unit (GPU), an accelerated processing unit (APU), a secure processing unit (SPU), a subsystem processor of specific components of the computing device, such as an image processor for a camera subsystem or a display processor for a display, an auxiliary processor, a single-core processor, a multicore processor, a controller, and a microcontroller. A processing device may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and time references. Integrated circuits may be configured such that the components of the integrated circuit reside on a single piece of semiconductor material, such as silicon.

As used herein, the term "computing device" refers to any one or all of vehicle management systems, display subsystems, driver assistance systems, vehicle controllers, vehicle system controllers, vehicle communication system, infotainment systems, vehicle display systems or subsystems, vehicle data controllers or routers, cellular telephones, smart phones, personal or mobile multi-media players, personal data assistants (PDAs), laptop computers, personal computers, tablet computers, smart books, palm-top computers, wireless electronic mail receivers, multimedia Internet enabled cellular telephones, vehicle controllers, and similar electronic devices which include a programmable processor and memory and circuitry configured to perform operations as described herein.

For ease of reference, the term "scan chain" is used to refer to a technique used in design for testing (DFT) technologies. Scan chain testing includes techniques that allow an SoC or any other computing device having a processor to selectively activate or use all flip-flops in a scan chain layer of a design as a shift register during scan testing. A scan chain layer may be a physical layer within an SoC inserted into the stack-up of the design layout. The flip flops within a scan chain layer of an SoC are connected to combinational logic that is used to perform various functions of an SoC. A scan chain test may be used to test the functional hierarchies (e.g., CPU, GPU, etc.) of a computing device or SoC. A scan chain may include the serial grouping of a number of flip flops within a circuit design in which each flip flop contains at least two logic gates. In some embodiments, scan chain testing may include shifting data patterns into the SoC in which the flip flops within the scan chain capture the functional data that results from the test pattern, and the results of the input patterns and flip flop data capture is shifted out of the flip flops. This internal scan increases the controllability and observability of SoC logic by connecting storage cells (e.g., flip flops having two or more logic gates) into a long shift register, or scan chain, and by enhancing the logic of these cells to support a scan-shift mode that allows for serial loading and unloading of scan chain contents.

As used herein, the term "scan stitching" refers to the process in logically and/or physically (e.g., electrically) connecting flip flops to create a scan chain. Scan stitching may be implemented in a design process of an SoC or other computing device to map or "chain" together the various flip flops within a chip design. Conventional scan stitching may include serially connecting the flip flops to create a scan chain using a netlist. In some embodiments, scan stitching may be physical-aware scan stitching that orders the flip flops according to their physical location within a chip design, as opposed to using a netlist to create the scan chain. Physical aware scan stitching may include ordering the flip flops in such a way that minimizes the total physical length of the resulting scan chain for purposes of reducing DFT test time. Thermal grid-aware scan stitching refers to the process of grouping and connecting flip flops to create scan chain segments, or sections, based on a logical grid configuration of an SoC.

The term "scan chain section" as used herein refers to one flip flop or a series of flip flops for performing scan chain testing. In some embodiments, a scan chain section may be a reconfigured or redesigned section or portion of a scan chain within a scan chain layer. For example, the scan chain may be reconfigured into multiple standalone scan chain sections during the design phase of a computing device. For example, a pre-fabrication scan chain may be organized via physical-aware scan-stitching, and then separated into scan chain sections (i.e. separate groups of flip flops) that may be activated and tested individually, each section having test data inputs and outputs.

As used herein, the term "flip flop" refers to a circuit that has two stable states and can be used to store state information. A flip flop may include at least two logic gates to perform storage functions. A group of at least two flip flops in a series configuration may be used as a shift register to shift state information bit by bit serially through the flip flops. In some embodiments, a flip flop may be referred to as a latch.

As used herein, the term "spatially" may refer to the physical orientation and/or location of a system component or area within the physical layout and stack-up or a computing device. For example, a group of flip flops may be referred to as being spatially associated with a grid portion of an SoC, where an SoC is logically divided into various portions with respect to the SoC physical layout and/or stack-up. A group of flip flops may be spatially associated with a grid portion such that the group of flips flops may be physically located within the logical boundaries of the grid portion. As another example, a group of flip flops, or a group of logic gates, may be spatially associated with a scan chain section, and therefore the scan chain section may be spatially associated with a corresponding grid portion that is spatially associated with the group of flip flops.

As used herein, the term "grid portion" refers to a physical portion of an SoC in three-dimensional space. For example, a grid portion may be a volume of an SoC fabrication, in which the grid portion is distinct from other grid portions as arranged in a top-down view of the SoC fabrication. A grid portion may include one or more SoC stacks or layers, or a portion of one or more stacks or layers within an SoC. In some embodiments, a grid portion may be referred to as a region of an SoC. In some embodiments, a portion of the SoC may not be a grid portion, but may be a physical portion of the SoC having a defined volume and/or shape distinct from a grid configuration. For example, a portion of the SoC may be dimensionally rectangular, or may be any other shape and volume as determined in a design stage of an SoC. Thus, an SoC may be logically divided into any number of portions, or regions, each having any variety of volumes, such that a single SoC may be logically divided into at least two portions.

Various embodiments include methods, system-on-a-chip (SoC) designs, processing devices, and memory that are configured to implement the methods for monitoring in-field characteristics of an SoC. Various embodiments may be configured to monitor in-field characteristics by implementing a scan chain to sequentially input test data into groups of logic gates corresponding to physical regions of an SoC, and by measuring on-chip thermal, IR drop, and power-grid reliability in response to the scan chain inputting test data.

Continuous and in-field monitoring of on-chip thermal characteristics, IR drop, and power grid reliability is an important safety and security requirement in certain types of systems, processors and SoCs. These in-field characteristics may be especially critical in systems where human safety is a priority, such as automotive vehicle systems. Failure or unexpected degradation (e.g., through excessive IR drop, power grid degradation, electromigration, etc.) of an SoC controlling safety features or other features for normal operation may occur with too little or no warning of an impending failure or error.

Existing sensors, such as temperature and voltage sensors, positioned throughout the physical profile of an SoC can provide read outs of the temperature and voltage values under a given workload. However, execution of a typical workload performing common operations may not exercise remote and discretized logic in the SoC sufficient to enable in-service monitoring of all regions of the SoC. For example, a workload may include functional data patterns activating combinational logic corresponding to a GPU, which may create power demands within a region of the SoC including the GPU for a certain period of time. As another example, a workload may include functional data patterns activating combinational logic corresponding to a CPU, which may create power demands within a different region of the same SoC for a period of time. While any one workload functional pattern is being implemented, the remaining portions of the SoC may be inactive or may not fully utilize the extent of the combinational logic for specific SoC functions. Thus, conventional workloads may not be able to provide rigorous enough power draw (i.e. sufficient temperature conditions) to uncover, or highlight, potential issues within an SoC that may be caused by thermal and electrical conditions. Thus, measuring temperature and voltage values under conventional workloads may not help in isolating and specifically identifying an exact reason for an SoC error or failure (e.g., aged power delivery network, increased IR drop values, on-chip or off-chip power attacks, hard errors, etc.).

Conventional scan chain testing seeks to provide more rigorous testing of an SoC as compared to functional workloads during normal operations. Conventional scan chains typically activate all of the flip flops within a scan chain layer simultaneously, causing all of the associated combinational logic to be activated simultaneously in response. As such, measuring thermal and electrical characteristics during the scan chain activation may provide some insight as to potential overarching issues within an SoC (e.g., thermal "hot spots," power constraints). However, because conventional scan chains are activated in an all-or-nothing manner, conventional scan chains may not allow for identifying specific sources of any observed problems or out-of-limit conditions. For example, activating a conventional scan chain may enable detecting a thermal hot spot; however, the specific circuitry within the SoC causing the thermal issue may not be identifiable based on conventional scan chain activations.

Various embodiments address safety and security considerations through continuous and in-field monitoring of on-chip thermal, power distribution network, and power grid reliability. Various embodiments may identify errors or failures associated with aging of the power grid on the SoC, which over time can lead to in-field functional failures due to poor voltage delivery. Various embodiments may identify trojans or hard attacks, which can cause high power leakage paths or burnouts when a particular logic gate is activated. Various embodiments may further characterize the thermal paths from individual gates to the rest of the SoC to confirm expected operation and no presence of off-chip influences (e.g., a redistribution layer).

Various embodiments include an SoC design particularly suitable for safety and security critical applications. For example, various embodiments may include circuitry, mechanisms, and methods for activating a selected and specific portion of an SoC design while operating in the field. Various embodiments may include circuitry and mechanisms to detect any changes in the SoC power delivery network (or power grid), such as caused by aging or attacks, by capturing the electrical response within the SoC caused by activating a specific design segment within the SoC. As another example, some embodiments may include circuitry and mechanisms to detect changes in the thermal path (i.e. on and off chip) by capturing the thermal response after activating a specific design segment within the SoC. As a further example, some embodiments may include circuitry and mechanisms to detect any trojans or hard fails in the design during in-field operation.

Various embodiments include separating a scan chain design into multiple sections, and clock gating each individual section. Separating a scan chain design into multiple sections may allow for the creation and testing of highly localized, power-dense regions on an SoC. By powering and/or activating each scan chain section separately, sequentially, or in any other configuration, various embodiments enable measuring the thermal and electrical responses present in other unpowered and/or inactive sections within the SoC. This allows in-field testing to isolate potential issues (e.g., aged power delivery network, increased IR drop values, on-chip or off-chip power attacks, hard errors, etc.) based on the responses measured throughout an SoC resulting from each individually activated scan chain section.

In some embodiments, a scan chain may be divided into separate logically located grid sections corresponding to a physical profile of an SoC. For example, during the physical design stage of an SoC, the physical profile of the SoC may be decomposed into a grid having different grid portions. Each grid portion may be logically overlaid on top of the SoC physical profile, such that each logical grid portion may be associated with circuitry within the corresponding physical area of the SoC. Thus, the flip flops of a scan chain layer may be separated similarly based on a grid configuration in which each portion of the grid may be associated with a number of flip flops. The flip flops in each grid may be chained—or stitched—together to create a single scan chain section, or segment, in which each segment may be activated individually to produce and measure a thermal and electrical responses at each other segment of the grid-based scan chain. Thus, thermal grid-aware scan stitching may stitch together flip flops for the purpose of determining thermal characteristics in a grid or grid-like configuration.

The grid-based scan chain segments may be clocked to individually activate each scan chain segment for purposes of measuring the corresponding responses at each other grid portion. For example, a scan chain layer may be designed to include clock gates before and after each portion of the grid (i.e. to isolate each scan chain segment). This allows for the gating of the clock propagation to downstream and upstream logic (i.e. the other flip flops in other portions of the grid and their associated combinational logic). Thus, various embodiments may provide a clock signal to a single group of flip flops associated with a grid portion, while gating the clock signal from other flip flops associated with other grid portions.

After design and tape-out, each clock gate associated with each grid portion may be serially chosen and activated through software to sequentially activate each chain of corresponding flip flops. For example, clocking one grid portion (i.e. the flip flops physically associated with that logical grid portion) may produce responses that are measurable by temperature and voltage sensors in other grid portions that have their clocks gated. Each portion of the grid may be sequentially activated by a clock gate controller to allow the SoC to determine the responses at each clocked-gated grid portion. The temperature and voltage measurements may be used for system characterization to identify potential issues caused by the clocked flip flops associated with an activated grid portion. In some embodiments, the thermal and electrical characteristics of an activated grid portion may be measured individually, or along with other grid portions that have their clocks gated. Thus, a scan-chain grid configuration can enable measuring thermal and electrical responses across any combination of grid portions, clocked or clock-gated, in response to activating any individual grid portion or any combination of grid portions. For example, one grid portion may be activated and thermal and electrical responses may be measured across the activated grid portion, another individual grid portion, multiple different grid portions, or all grid portions simultaneously.

In some embodiments, the clock signaling used to activate each individual grid portion, or scan chain section, may be a high-speed clock signal (e.g., turbo-shifted clock, 3.2 GHz clock). Shifting the data input into each group of flip flops at high frequencies can cause the SoC to draw power at levels higher than in normal operations (referred to herein sometimes as "high power") to implement the combinational logic associated with each clocked flip flop. By increasing the power requirements for shifting data into the flip flops at high speeds, thermal and electrical responses produced at other sections of the SoC may be more readily measurable, and therefore any associated errors or attacks may be more easily identifiable. Thus, various embodiments enable briefly activating individual grid portions while characteristic measurements (e.g., temperature, voltage, current, etc.) are obtained in other grid portions, and rapidly repeating this process for many or all individual grid portions so that measured characteristics are consistent on average with normal operations (in which many grids are activated) while enabling changes in measurements to be associated with particular one or few grid portions. This capability enables potential performance of life-limiting issues that occur during normal operation to be detected while at the same time enabling the sources of such issues to be localized to one or a few grid portions.

FIG. 1 illustrates a system including a computing device 10 suitable for use with various embodiments. The computing device 10 may include an SoC 12 with a processor 14, a memory 16, a communication interface 18, a storage memory interface 20, and sensors 28. The computing device 10 may further include a communication component 22, such as a wired or wireless modem, a storage memory 24, and an antenna 26 for establishing a wireless communication link. The processor 14 may include any of a variety of processing devices, for example a number of processor cores.

An SoC 12 may include one or more processors 14. The computing device 10 may include more than one SoC 12, thereby increasing the number of processors 14 and processor cores. The computing device 10 may also include processors 14 that are not associated with an SoC 12. Individual processors 14 may be multicore processors. The processors 14 may each be configured for specific purposes that may be the same as or different from other processors 14 of the computing device 10. One or more of the processors 14 and processor cores of the same or different configurations may be grouped together. A group of processors 14 or processor cores may be referred to as a multi-processor cluster.

The memory 16 of the SoC 12 may be a volatile or non-volatile memory configured for storing data and processor-executable code for access by the processor 14. The computing device 10 and/or SoC 12 may include one or more memories 16 configured for various purposes. One or more memories 16 may include volatile memories such as random access memory (RAM) or main memory, or cache memory. These memories 16 may be configured to temporarily hold a limited amount of data received from a data sensor or subsystem, data and/or processor-executable code instructions that are requested from non-volatile memory, loaded to the memories 16 from non-volatile memory in anticipation of future access based on a variety of factors, and/or intermediary processing data and/or processor-executable code instructions produced by the processor 14 and temporarily stored for future quick access without being stored in non-volatile memory.

The memory 16 may be configured to store data and processor-executable code, at least temporarily, that is loaded to the memory 16 from another memory device, such as another memory 16 or storage memory 24, for access by one or more of the processors 14. The data or processor-executable code loaded to the memory 16 may be loaded in response to execution of a function by the processor 14. Loading the data or processor-executable code to the memory 16 in response to execution of a function may result from a memory access request to the memory 16 that is unsuccessful, or a "miss," because the requested data or processor-executable code is not located in the memory 16. In response to a miss, a memory access request to another memory 16 or storage memory 24 may be made to load the requested data or processor-executable code from the other memory 16 or storage memory 24 to the memory 16. Loading the data or processor-executable code to the memory 16 in response to execution of a function may result from a memory access request to another memory 16 or storage memory 24, and the data or processor-executable code may be loaded to the memory 16 for later access.

The storage memory interface 20 and the storage memory 24 may work in unison to allow the computing device 10 to store data and processor-executable code on a non-volatile storage medium. The storage memory 24 may be configured much like an embodiment of the memory 16 in which the storage memory 24 may store the data or processor-executable code for access by one or more of the processors 14. The storage memory 24, being non-volatile, may retain the information after the power of the computing device 10 has been shut off. When the power is turned back on and the computing device 10 reboots, the information stored on the storage memory 24 may be available to the computing device 10. The storage memory interface 20 may control access to the storage memory 24 and allow the processor 14 to read data from and write data to the storage memory 24.

The sensors 28 may be communicatively coupled to the processor 14, the memory 16, the communication interface 18, and the storage memory 20 via a bus or other communication link. The sensors 28 may include thermal sensors and/or voltage sensors physically located within the SoC 12. The sensors 28 may measure thermal and electrical characteristics (e.g., temperature and voltage values) throughout the SoC 12 during testing and normal operating procedures as described by embodiments. Temperature values and voltage values measured by the sensors 28 may be conveyed to the processor 14 for processing, stored in the memory 16, and/or conveyed from the SoC 12 through the communication interface 18 to other components in the computing device 10.

Some or all of the components of the computing device 10 and/or the SoC 12 may be arranged differently and/or combined while still serving the functions of the various embodiments. The computing device 10 may not be limited to one of each of the components, and multiple instances of each component may be included in various configurations of the computing device 10. For example, the communication interface 18 may be used to convey measured in-field characteristics to the communication component 22. The communication component 22 may relay the measured in-field characteristics to external additional computing devices for purposes of diagnosing any errors based on the in-field characteristics. Similarly, the memory 16, storage memory interface 20, and storage memory 24 may store and convey the measured in-field characteristics and other associated data as according to the various embodiments.

Figure 2A:
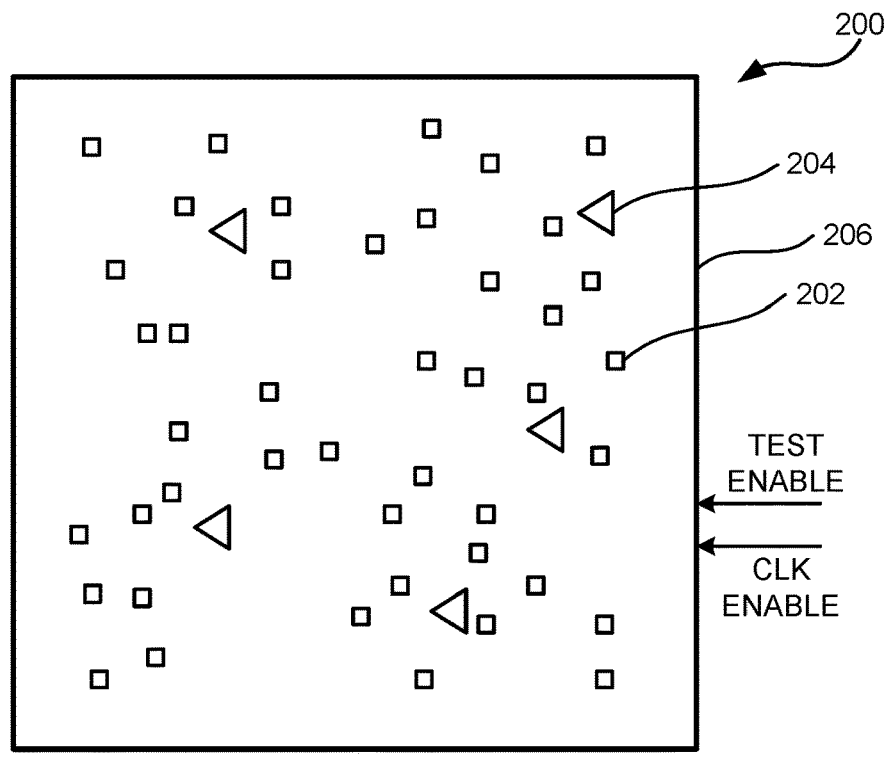
FIG. 2A illustrates an example of a conventional scan chain layer 200 prior to scan stitching.

FIG. 2A illustrates an example of a conventional scan chain layer 200 prior to scan stitching. The scan chain layer 200 may be an integrated circuit layer within an SoC 206 having various flip flops 202 and integrated clock gating (ICG) components 204. The ICG components 204 may be used to clock gate the flip flops 202 after connecting the flip flops via scan stitching. The SoC 206 layout has a plurality of flip flops 202 and a plurality of ICG components 204.

Figure 2B:
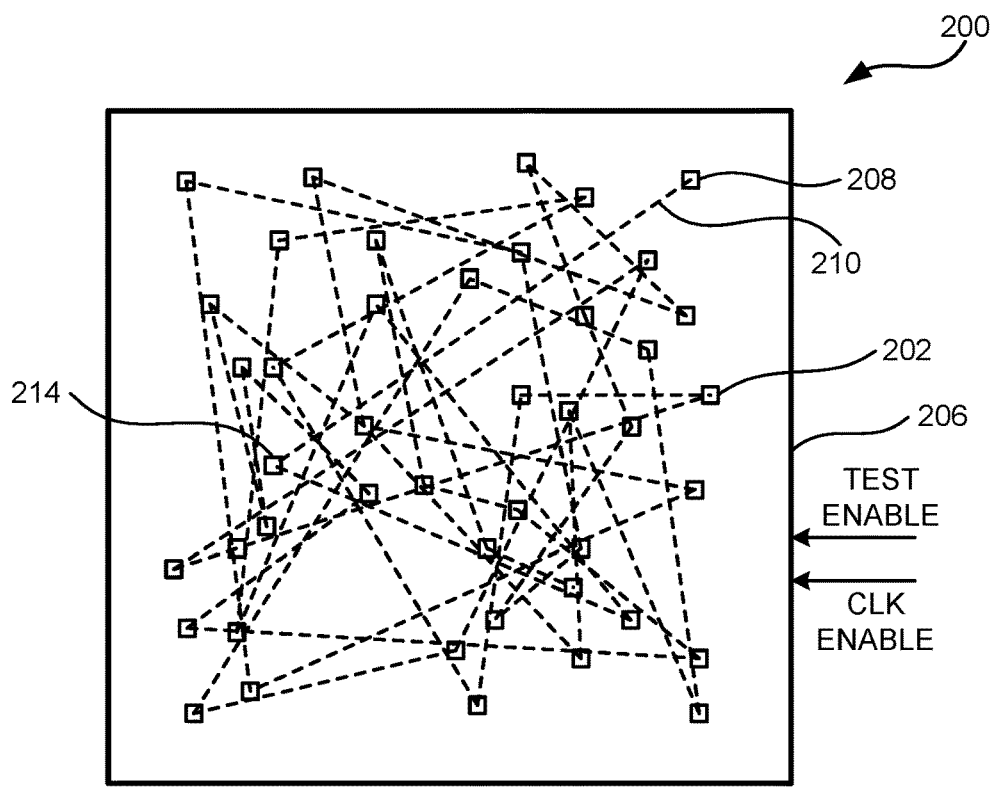
FIG. 2B illustrates an example of a conventional scan chain layer 200 after scan stitching.

FIG. 2B illustrates an example of the conventional scan chain layer 200 after scan stitching. Typical implementation of a scan chain includes serially coupling multiple flip flops (or scan registers) to form one or more scan chains within an SoC. During the design phase of an SoC, a scan chain layer may be implemented to implement DFT to locate potential issues within an SoC. The purpose of implementing a scan chain within an SoC is to make testing easier by providing a way to set and observe every flip-flop in the SoC.

As illustrated in FIG. 2B, a number of flip flops 202 in the SoC 206 are connected together to form a single scan chain. During the design phase of the conventional SoC 206, a normal, or logical, scan stitching occurs based on a generated netlist such that the stitching, or linking, of flip flops for testing purposes within the scan chain layer 200 are ordered serially according to the netlist. The result of a conventional stitching of a scan chain layer 200 is shown by the scan chain 210, which connects each of the flip flops 202 sequentially without regard to physical location within the SoC 206 profile. The scan chain 210 is illustrated as a dashed line for representation purposes only, and merely represents the logical connections between the flip flops 202, not the physical/electrical connections as would be shown by a circuit schematic. For example, a scan chain 210 as shown in the conventional scan chain layer 200 illustrated in FIG. 2B may begin at flip flop 208. The flip flop 208 may be connected electrically to flip flop 214, as logically shown by the line 210. The scan chain stitching may proceed to connect the remaining flip flops 202 until each flip flop within the scan chain layer 200 has been included in the scan chain 210.

In conventional scan chain designs, "scan_in" and "scan_out" signals, or the like, define the input and output of a scan chain in which the scan_in signal may be a predefined test pattern or randomly generated test pattern. The scan_in signal may be input to the first flip flop within a scan chain and the last flip flop in the scan chain may output the scan_out signal that includes information regarding the response of the combinational logic to the scan_in signal (i.e. the state of each flip flop in the scan chain). For example, a scan_in signal may be input to the flip flop 208, and shifted serially through the remaining flip flops 202 until reaching the last flip flop of the scan chain 210, which then outputs the scan_out signal. For an SoC implementing more than one scan chain in one or more scan chain layers, multiple scan_in and scan_out signals may be used.

Conventional scan chain designs include a scan enable pin, or test enable pin, within the scan chain layer 200. Enabling the test enable pin may cause all of the flip flops 202 to be connected into a single long shift register (i.e. scan chain 210) in preparation of testing. A clock enable pin or signal may then be sent to each of the ICGs (not shown in FIG. 2B) to clock all of the serially connected flip flops 202 to initiate shifting in and propagating the scan_in test data. The frequency of the clock can control the rate at which the test pattern is propagated throughout the scan chain and the how quickly the scan_out signal is read out of the last of the flip flops 202.

Conventional scan stitching configurations, as illustrated by the example in FIG. 2B, can test the entire series of flip flops 202 at once. However, this requires a significant amount of time due to the delay caused by the distances between each of the flip flops 202, such that the electrical signals representing the test data must physically travel between each of the flip flops 202 along the scan chain 210. Physical-aware scan stitching addresses this problem by ordering the flip flops in a spatial manner. Physical-aware scan stitching can organize the scan layer connections between flip flops by connecting each flip flop to a next closest proximate flip flop that has not already been ordered within the scan chain, or in some similar manner to stitch a scan chain having the shortest total length. By implementing a physical-aware scan stitching, the test time for performing a single scan is significantly reduced, since the electrical signals representing the test data do not have to travel as long distances as in normal, non-physical-aware scan stitching.

However, conventional scan stitching and conventional physical-aware scan stitching are unable to isolate or precisely indicate specific issues (e.g., power or thermal issues) with respect to various physical portions, or regions, of a layout and/or stack-up of the SoC. In both non-physical aware and physical-aware scan chain implementations, the ICGs are used for power reduction purposes during scan chain data capture, but are toggled simultaneously. Because the test enable pin activates all ICGs at once, all flip flops 202 are activated simultaneously and test data is run through the scan chain to determine scan_out data. This prevents the SoC 206 from determining whether any specific areas, or regions, of concern throughout the physical profile of the SoC 206 were the result of any other areas/circuitry of the SoC 206 or any specific groupings of the flip flops 202.

Figure 2C:
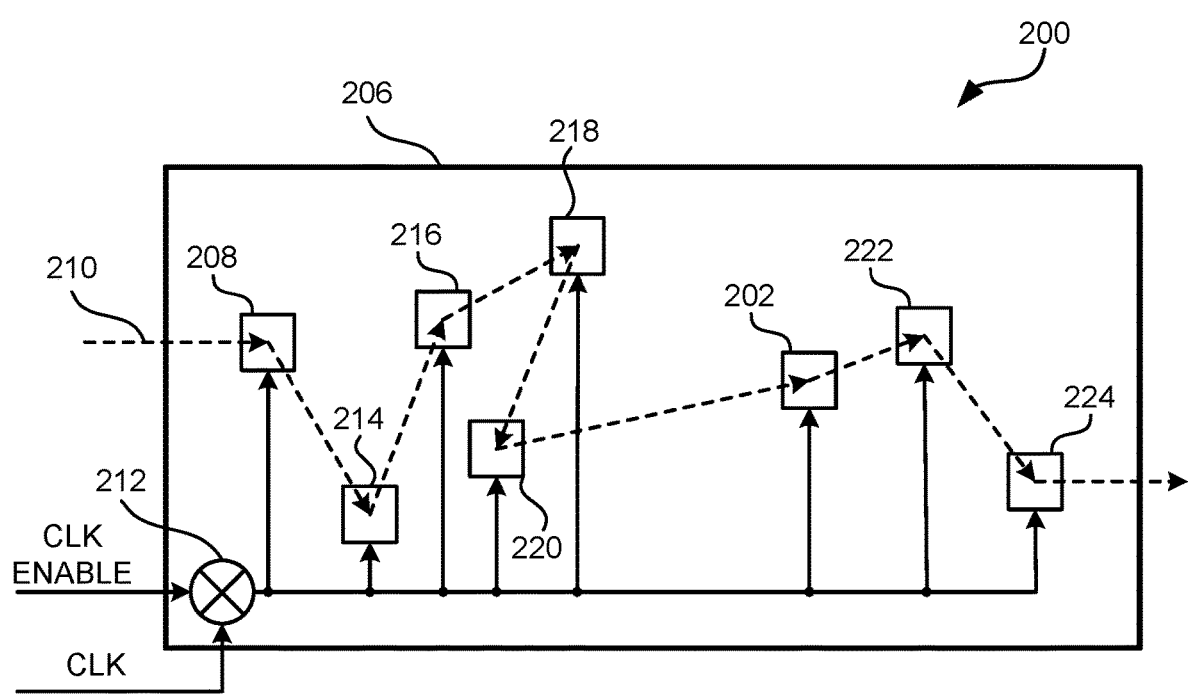
FIG. 2C illustrates an example of a portion of a conventional scan chain layer 200 including integrated clock gating.

The inability to activate combinational logic in a regionally-based manner to determine the effects of activated circuitry across various other regions of an SoC is illustrated in FIG. 2C. FIG. 2C shows an example of an expanded view of a portion of a conventional scan chain layer 200 including integrated clock gating. In conventional scan chains configurations, ICGs may be spread throughout a physical profile of an SoC to simultaneously activate all flip flops within a scan chain. For example, an ICG component 212 may be designated during a design phase, based on a netlist, to provide clock gating for flip flops 208, 214, 216, 218, 202, 220, and 222 within the scan chain 210. Additional groupings of flip flops along the scan chain 210 can be designated to be clocked by additional ICG components 204. A clock gate controller may be used to toggle the ICG component 212 and other ICG components 204 to simultaneously activate all flip flops in the scan chain 210. In addition to the all-or-nothing activation of the scan chain 210 as previously described with respect to toggling the ICG components 204, the randomized or outspread physical placement of the flip flops corresponding to each ICG components 204 prevents the identification of potential issues within specific regions of the SoC that may occur as a result of activating specific portions of functional circuitry. For example, with reference to FIGS. 2B and 2C, the outspread physical placement of the flip flops 202, 208, and 214 along the scan chain 210 do not allow for isolated DFT of specific regions of the SoC.

Figure 3:
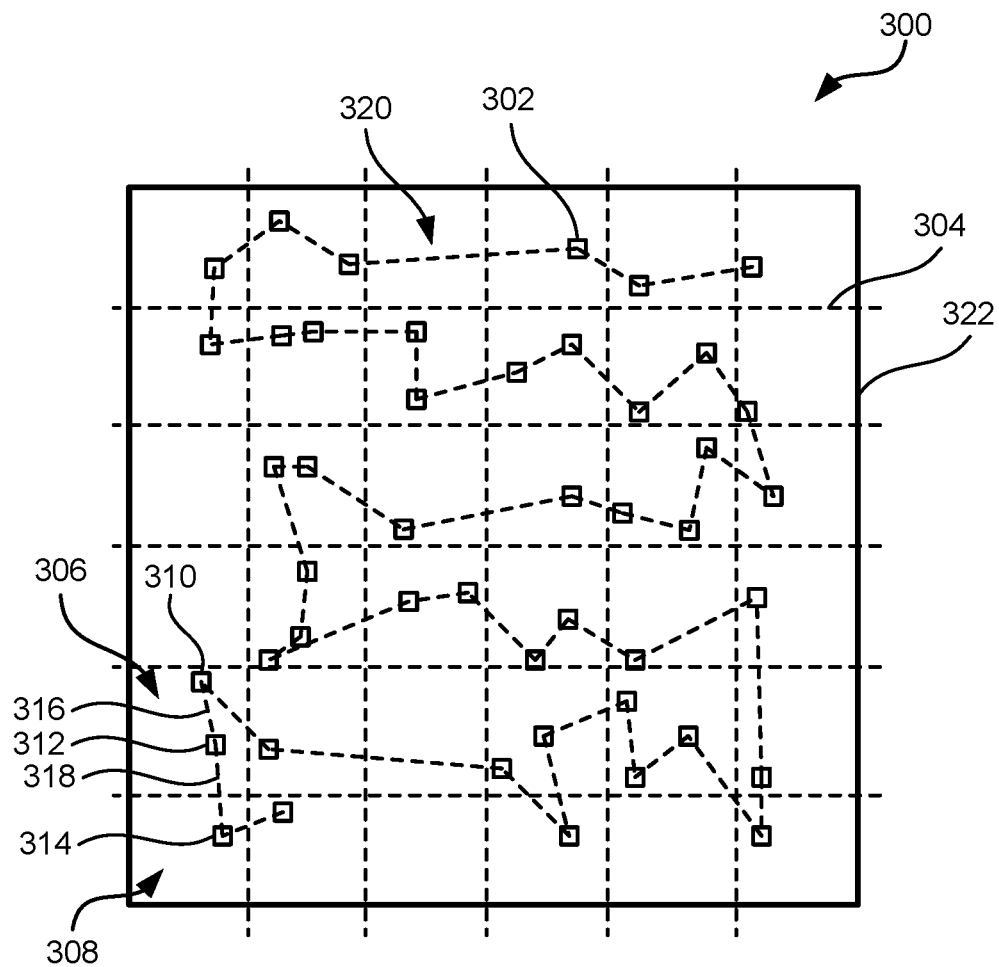
FIG. 3 illustrates an overview of a scan chain layer during the design process suitable for implementing various embodiments.

FIG. 3 illustrates an overview of a scan chain layer 300 during the design process suitable for implementing various embodiments. The scan chain layer 300 may be implemented within an SoC 322 in which the scan chain layer 300 includes a number of flip flops 302. A logical grid 304 may be overlaid over the physical profile of the SoC 322 and the scan chain 320 may be reassembled based on the grid 304 for thermal characterization purposes. The scan chain 320 is illustrated as a dashed line for representation purposes only, and merely represents the logical connections, and not the actual electrical circuit connections between the flip flops 202.

During the design process, the flip flops 302 may be ordered within a scan chain layer 300 to form a scan chain 320. The scan chain 320 may be stitched using physical-aware scan stitching, or some other manner of scan stitching that prioritizes an efficient scan chain layout to reduce the delay otherwise exhibited in conventional non-physical-aware and conventional physical-aware scan stitching and testing. The flip flops 302 may be ordered manually, algorithmically, or through other means of automation (e.g., neural networks) to determine an optimized scan chain 320 layout.

The design processes, scan chain layout tools, or mechanisms may determine an optimized scan chain 320 layout by considering factors such as a shortest total physical length of the connections between the flip flops 302 in the scan chain layer 300. Other factors may include a shortest total distance between the next few or more flip flops. For example, a series of five flip flops to be ordered within a scan chain may have different total scan chain path distances depending on how the flip flops are ordered. A next closest flip flop may ultimately cause the remaining three flip flops to be further from the remaining flip flops to be ordered. Thus, in this example, ordering the other three flip flops into the scan chain prior to the next closest flip flop may produce a shorter total scan chain distance. Other factors that may determine how a scan chain is ordered may include the total number of flip flops in a designated physical area of an SoC, whether certain flip flops are connected to certain combinational logic having shared functionality, or whether any flip flops are located in areas that are anticipated to exhibit minimal or no errors or if any anticipated errors are insignificant for in-field testing and monitoring purposes.

For example, the scan chain 320 of the scan chain layer 300 illustrated in FIG. 3 has been manually ordered based at least in part on physical-aware scan stitching. As an example of a portion of scan chain 320, scan chain 320 may include flip flop 310 having a logical connection 316 to flip flop 312, and flip flop 312 may have logical connection 318 to flip flop 314.

After any initial scan stitching, the scan chain 320 may be reassembled based on a scan chain grid for thermal characterization. In some embodiments, the scan chain may be assembled using a scan chain grid without any prior scan stitching (e.g., physical-aware scan stitching). In some embodiments, the reassembling of the scan chain after any initial scan stitching may include reorganizing the initial scan stitching. For the example illustrated in FIG. 3, the scan chain 320 may be separated into logically located grid sections corresponding to a physical profile of the SoC 322. For example, during the physical design stage of the SoC 322, the physical profile of the SoC 322 may be decomposed into a grid 304 (represented as dashed intersecting perpendicular lines distinct from the dashed lines illustrating the scan chain 320) having different grid portions. Each grid portion may be logically overlaid on top of the SoC 322 physical profile, such that each grid portion can be logically associated with the various flip flops located across the SoC 322 physical profile. For example, a grid portion 306 may be logically associated with flip flops 310, 312 that are physically located in the SoC 322 corresponding to grid portion 306 of the grid 304. As another example, a grid portion 308 may be logically associated with a flip flop 314.

In some embodiments, grid partitions may be manually selected, or selected via software (e.g., via algorithm, artificial intelligence/neural networks, etc.). For example, a number of grid partitions and a size and/or shape of the grid partitions may be selected or determined. In some embodiments, the partitions may be in a non-grid configuration, which may be useful for testing a non-uniform SoCs, or for focusing testing on specific areas of the SoC. For example, a design may implement a partition, based on circuit functions, such as a power circuit or memory, or any specific physical area within the SoC that may be expected to produce errors. For example, a partition may be any shape or size within the SoC profile to group any number of flip flops associated with a logical scan chain section.

In some embodiments, grid partitions may be based on a predefined number of flip flops to be associated with each grid partition. For example, a maximum number of flip flops may be attributed to one grid partition, and then attribute the next flip flop up to a same or different maximum number of flip flops to the next grid partition, and so on. In some embodiments, the grid 304 may be selected and overlaid onto the SoC 322 based on a physical distance between flip flops. For example, a maximum or minimum distance between flip flops may be preset or determined by software instructions to group flip flops within various grid partition. For example, flip flops less than 20 nanometers (nm) apart may be grouped together in separate partitions, and a next flip flop at a distance greater than 20 nm may begin a new grid partition.

Reassembling or reorganizing the scan chain 320 through implementation of a grid may be used to define thermal characterization of the SoC 322 as described herein. Separating a scan chain into grids, or sections, may allow the flip flops associated within each section to be activated separately from the flip flops in all other sections. When activating a section of the grid, thermal and electrical responses may be measured using temperature sensors and voltage sensors located at every other section of the grid. For example, the grid portion 306 may be activated (i.e., clocked as described with reference to FIG. 4) to shift generated test data into the flip flop 310 and out of the flip flop 312. Thermal and electrical responses may be measured across each grid portion, including grid portion 308, while data is being shifted through the flip flop 310 and flip flop 312 at high rates. Each group of flip flops corresponding to each section of the grid may be activated sequentially to develop a complete characterization of thermal and electrical responses measured throughout the SoC. This allows for complete and continuous in-field monitoring of thermal and electrical characterization of the SoC.

Figure 4:
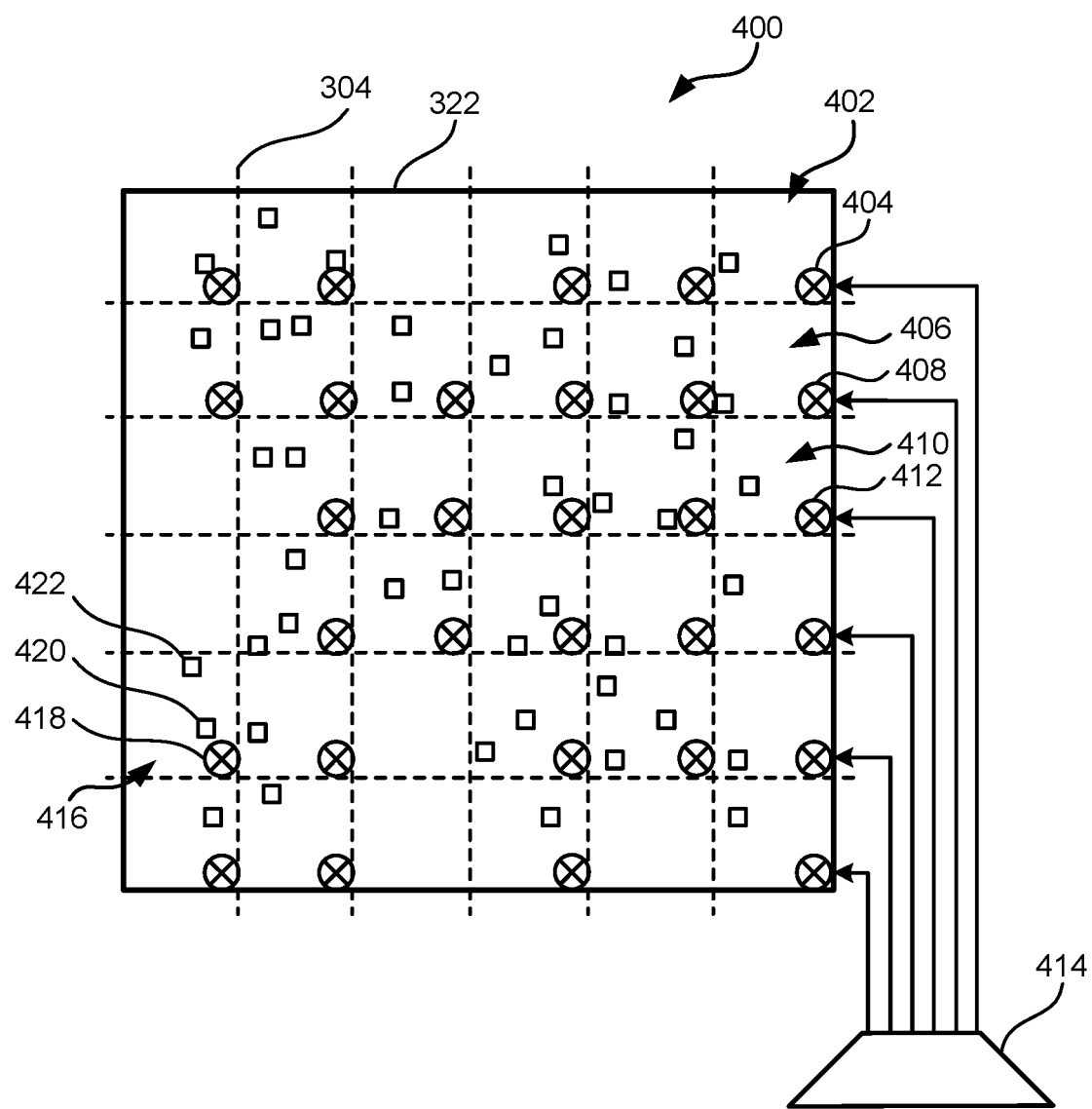
FIG. 4 illustrates an overview of a scan chain layer imbedded with clock gating for implementing various embodiments.

FIG. 4 illustrates an overview of a scan chain layer 400 imbedded with clock gating for implementing various embodiments. Clock gates may be assigned to each grid portion to clock each group of flip flops spatially associated with each grid portion. A flip flop, sometimes referred to as a latch, is a circuit implementing at least two logic gates to store state information. A group of logic gates may therefore be used to form one or more flip flops, such that each flip flop contains at least two logic gates. During the design process, clock gates may be inserted into the SoC 322 circuitry to gate the clock propagation to downstream and upstream logic (i.e., the other flip flops in other portions of the grid and their associated combinational logic). A clock gate controller 414 may be used to individually control, or toggle, the status of each clock gate associated with each grid portion. Although shown as being outside the physical profile of the SoC 322 for illustration purposes, it is to be understood that the clock gate controller 414 may be a circuit component located within the physical profile of the SoC 412.

Clock gating and a clock gate controller 414 may be integrated into the circuit design of the SoC 322 during the design process. The SoC 322 having a grid 304 may have clock gating imbedded into the SoC 322 design, such that a clock gate can be spatially associated with a portion of the grid 304. The clock gating may then be configured, or toggled, via the clock gate controller 414, to forward, or provide, a clock signal to the flip flops associated with a specific grid portion. Providing a clock signal to a group of flip flops activates the flip flops to then shift any input data (e.g., scan_in) through the flip flops associated with that grid portion.

Based on the data shifted in, the flip flops may produce an output (e.g., scan_out) based on the functionality of the combinational logic associated with those flip flops. This is illustrated in grid portion 416 in FIG. 4 which is shown as having flip flops 420 and 422. A clock gate 418 may be inserted into the circuitry design of SoC 322. The clock gate 418 may be configured, or toggled, by the clock gate controller 414 (connection not shown) to allow the clock gate 418 to forward a clock signal to the flip flops 420 and 422. In response to receiving the forwarded clock signal, the flip flops 420 and 422 may begin shifting test data for purposes of thermal and electrical characterization of the SoC 322.

While one section of flip flops associated with one portion of a grid is shifting test data (i.e., the section of flip flops that is activated by being provided a clock by a clock gate), the remaining flip flops throughout the SoC 322 may remain clock gated (i.e., not provided a clock) and therefore inactive. For example, the SoC 322 may have a grid separating flip flops into grid portions 402, 406, and 410, among other grid portions shown. The grid portions 402, 406, and 410 may be designed to include clock gates 404, 408, and 412 respectively.

During any DFT or in-field monitoring of the SoC 322, the clock gate controller 414 may toggle the clock gates 404, 408, and 412 sequentially to provide high speed clock signaling to the flip flops associated with each of the grid portions 402, 406, and 410. The clock gate controller 414 may configure a clock gate 404 to provide a clock signal to the flip flops associated with the grid portion 402, while configuring clock gate 408 and 412 to prevent a clock signal from being provided to the flip flops associated with grid portions 406 and 410. By activating a single portion of the grid 304 while clock gating most if not all other portions, in-field characteristics (e.g., thermal and electrical characteristics) may be measured by sensors at each clock gated portion of the grid 304. For example, activating the flip flops in grid portion 402 through the clock gate controller 414 and clock gate 404 may produce thermal and electrical responses to the high-speed shifted test data measurable in grid portions 406 and 410, and all other grid portions of the grid 304. The responses can be measured by thermal sensors and voltage sensors located within the grid portions 406 and 410 and all other grid portions.

Once sufficient time has passed for sufficient test data to shift through the flip flops associated with the grid portion 402 to measure a response throughout the SoC 322, the clock gate controller 414 may configure and stop the clock gate 404 from providing a clock signal to the flip flops associated with grid portion 402. Each portion of the grid 304 may then be serially activated through software implemented on the SoC 322 in a similar manner. For example, after activating the grid portion 402 and configuring the clock gate 404 to stop forwarding the clock signal, the clock gate controller 414 may configure the clock gate 408 to forward the clock signal to flip flops associated with grid portion 406. Test data can be shifted through the flip flops associated with the grid portion 406, and responses can be measured at all other grid portions, including grid portions 402 and 410. The clock gate controller 414 may then configure and stop the clock gate 408 from providing a clock signal to the flip flops associated with grid portion 406. After activating the grid portion 406 and configuring the clock gate 408 to stop forwarding the clock signal, the clock gate controller 414 may configure the clock gate 412 to forward the clock signal to flip flops associated with grid portion 410. This process may be repeated serially and sequentially for each grid portion of the SoC 322 until each grid has been activated.

In some embodiments, the serial and sequential testing of each grid portion may be repeated to begin testing at a first grid location (e.g., grid portion 402). This allows for continuous and in-field testing of an SoC. Such testing may be advantageous for detecting errors, attacks, or hardware degradation (e.g., aged power delivery network, increased IR drop values, on-chip or off-chip power attacks, hard errors, etc.) that may be more easily identifiable through repeated testing. For example, a thermal issue caused by circuit/wire degradation may be more readily detected by performing multiple iterations of sequential grid portion testing, enabling observation of changes in thermal characteristics over time or between sequential tests that may be caused by an issue developing in a specific grid portion.

In some embodiments, the test data (e.g., scan_in) may be shifted into the flip flops at high frequencies (e.g., turbo frequency, 3.2 GHz, etc.) to create significant power travelling through the circuitry of a group of flip flops and corresponding combinational logic. By shifting test data through the flip flop at high frequencies, thermal and electrical responses may be more readily observable and measurable at other grid location than possible shifting data at normal or operating frequencies. Causing the active portion (s) of the grid to heat up more than in normal operations may allow for in-field measurements of thermal characterization of an SoC, which may indicate a variety of potential errors or attacks (e.g., aged power delivery network, increased IR drop values, on-chip or off-chip power attacks, hard errors, etc.). Due to the speed of high speed shifting and for purposes of in-field monitoring of thermal and electrical characterization of the SoC, scan_out data may be ignored in some embodiments.

In some embodiments, a thermal and electrical response can be measured by temperature and voltage sensors located within an active grid portion, in addition to inactive grid portions. For example, while the flip flops of grid portion 402 are activated via a forwarded clock signal from the clock gate 404, temperature sensors (e.g., TSENS) and voltage sensors spatially located within the grid portion 402 can measure thermal and electrical responses based on the actively-shifted test data.

In some embodiments, more than one section of the grid 304 may be active at a time. For example, clock gate controller 414 may configure clock gates 404, 408, and 412 to forward clock signals to flip flops associated with the grid portions 402, 406, and 410. Test data can then be shifted through the flip flops of each grid portion 402, 406, and 410, and thermal and electrical responses may be measured throughout all other grid locations. This testing method may be useful when characterizing portions of the SoC 322 that are associated with specific circuit functionality. For example, it may be desirable to activate and test grid portions 406 and 410 simultaneously if the grid portions 406 and 410 and corresponding combinational logic provide power supply control functionality. In some embodiments, all sections of the grid may be activated to execute "full load" testing, and in-field characteristics can be measured from all portions of the grid.

In some embodiments, clock gates may not be inserted into circuitry at some grid locations. For example, a grid portion may have few or no flip flops, such as when a design layout results in an area of an SoC having little or no combinational logic. As another example, certain combinational logic and/or circuit-specific functionality may be of little to no interest for DFT or in-field monitoring, such as circuitry/transistor logic that has been proven to be effective, free of hardware issues, and/or not prone to attacks. In these examples, it may be beneficial to not include clock gating in the corresponding grid portions to reduce the total time for monitoring in-field characteristics. Reducing the number of grid portions to activate for sequential testing of an SoC may reduce the total test time, as well as simplify the SoC design.

Figure 5:
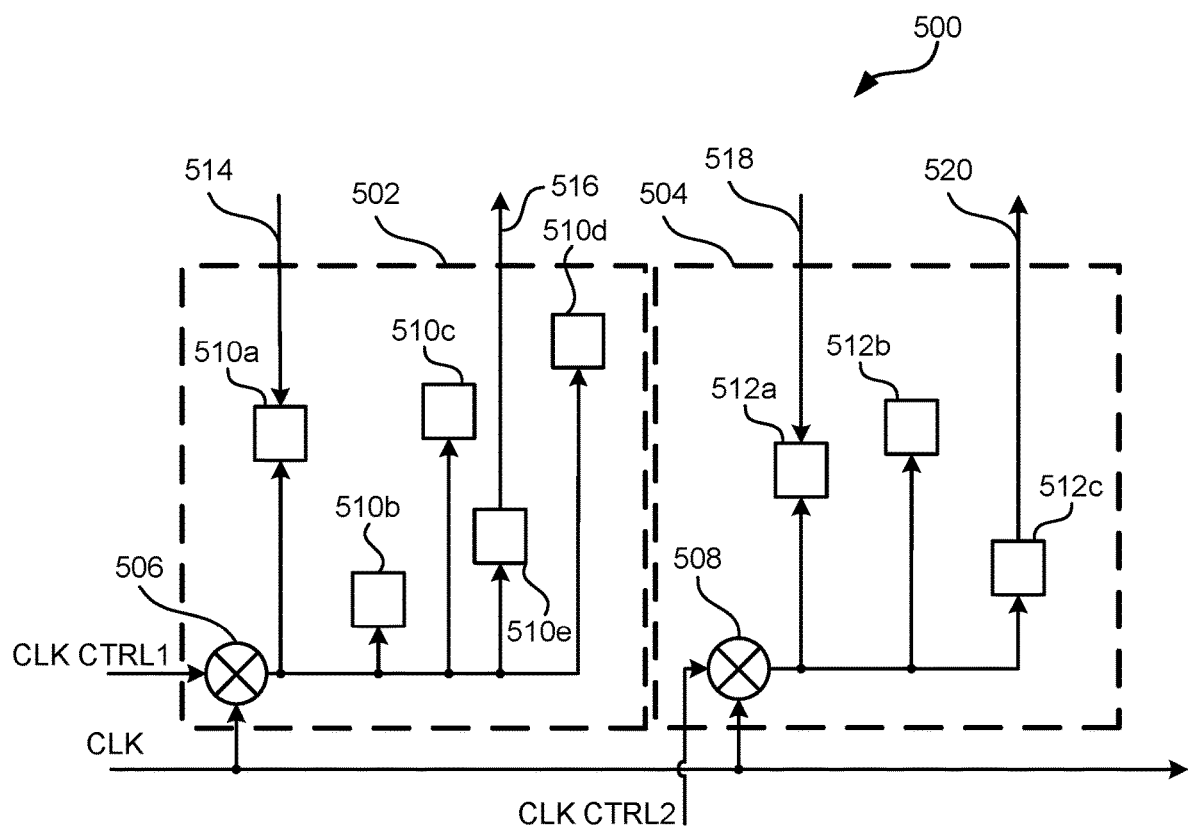
FIG. 5 illustrates an overview of two example scan chain grid portions of a scan chain layer for implementing various embodiments.

FIG. 5 illustrates an overview 500 of two example scan chain grid portions of a scan chain layer for implementing various embodiments. A flip flop, sometimes referred to as a latch, is a circuit implementing at least two logic gates to store state information. A group of logic gates may therefore be used to form one or more flip flops, such that each flip flop contains at least two logic gates. An SoC may contain a grid portion 502 associated with flip flops 510a-e and a clock gate 506, and a grid portion 504 associated with flip flops 512a-c and a clock gate 508. The clock gates 506 and 508 may be toggled by a clock gate controller via distinct clock configuration signals (e.g., CLK CTRL 1, CLK CTRL 2). Configuring the clock gate 506 to forward a clock signal to flip flops 510a-e may cause flip flops 510a-e to shift test data sequentially through the flip flops 510a-e. Configuring the clock gate 508 to forward a clock signal to flip flops 512a-c may cause flip flops 512a-c to shift test data sequentially through the flip flops 512a-c.

As described above, implementation of a grid configuration, or any other configuration used to section the flip flops into groups, may readjust or reassemble the scan chain originally developed, assuming a scan chain layout was developed prior to implementing a grid configuration. For example, a scan chain may have been developed prior to implementing a grid configuration. Such a scan chain, based at least in part on a physical-aware scan stitching as described previously, may order all of the flip flops sequentially to create a single long scan chain. For example, with reference to FIG. 5, a scan chain may have been originally design to logically connect flip flops 510a-510e and flip flops 512a-c. Assuming no grid configuration for in-field monitoring were to be implemented, and therefore no grid clocking, the scan chain would shift test data (e.g., scan_in) into the flip flop 510a, sequentially through the flip flops 510b-510e and 512a, b, and output a response (e.g., scan_out) from the flip flop 512c.

Implementing a scan chain grid, and inserting clock gating may restructure an originally designed scan chain (e.g., a scan chain based on a netlist or physical-aware scan stitching) so that each grouping of flip flops for each respective grid portion 502 and 504 is electrically inserted between a decompressor and compressor. Restructuring an originally designed scan chain based on a grid configuration may be performed manually, algorithmically, or through neural networks. Implementing a grid configuration may allow for each group of flip flops associated with each grid portion of an SoC to be inserted between one or more sets of decompressors and compressors. Restructuring the scan chain based on a grid configuration may include connecting a first flip flop within a grid portion to the output of a decompressor, and a last flip flop within a grid portion to the input of a compressor. The first flip flop may be defined as the flip flop that either began the scan chain or the flip flop that would have received shifted test data from a last flip flop of a previous grid portion. The last flip flop may be defined as the flip flop that either ends the scan chain or the flip flop that would have shifted test data to a first flip flop of a next grid portion.

For example, flip flops 510a-e associated with grid portion 502 may be connected to a decompressor output 514 and compressor input 516. A decompressor may insert shift test data into flip flop 510a (i.e. the first flip flop of grid portion 502) via decompressor output 514, and the flip flops 510a-e may serially shift the test data when the clock gate 506 is configured to forward a clock signal. Based on the grid configuration, instead of the test data being shifted through to flip flop 512a according to an originally designed scan chain (i.e. because flip flops 512a-c are inactive/not clocked), the test data may be shifted out (e.g., scan_out) to a compressor input 516 from the flip flop 510e (i.e. the last flip flop of grid portion 502). In a similar manner, flip flops 512a-c associated with grid portion 504 may be connected to a decompressor output 518 and a compressor input 520. A decompressor may insert shift test data into the flip flop 512a via decompressor output 518, instead of the flip flop 512a receiving test data shifted from the flip flop 510e according to an originally designed scan chain. The flip flops 512a-c can serially shift the test data when the clock gate 508 is configured to forward a clock signal. Based on the grid configuration, instead of the test data being shifted through to another flip flop at another grid portion along an originally designed scan chain, the test data is shifted out (e.g., scan_out) to a compressor input 520 from the flip flop 512c (i.e. the last flip flop of grid portion 504).

In some embodiments in which physical-aware scan stitching or some other manner of scan stitching that prioritizes an efficient scan chain layout has been applied in the design process, implementing a grid configuration may restructure the existing scan chain based on the size and shape of the grid portions. For example, the flip flops 510a-e and flip flops 512a-c may have been ordered based on physical-aware scan stitching that prioritized a shortest total scan chain length in order to minimize test time (e.g., reduce total physical distance electrical signals for shifted test data are carried). However, in a grid configuration, concerns for a total scan chain length through all grid portions may be inconsequential or different as compared to total scan chain length within an individual grid portion as defined by the distance between the decompressor, through the flip flops, and to the compressor.

When applying a grid configuration to a preexisting scan chain layout, the logical connections may be reorganized in any possible way suitable for reducing total test time. Thus, when applying a grid configuration, any existing scan chain ordering may be used as a base and adjusted, or completely overridden. For example, the logical ordering of flip flops 510a-e may have been based on a shortest total scan chain length prior to implementing a grid configuration. Through manual implementation or automated layout tool mechanisms applying algorithms or neural networks, the scan chain ordering of flip flops 510a-e as shown may be restructured to swap the order of flip flop 510d with 510e, such that 510d is the last flip flop in the grid portion 502. This would allow for a shorter total scan chain length within the grid portion 502, and therefore reduced test time for in-field monitoring.

In some embodiments, a grid configuration may implement the first instance of scan stitching, such that no previous scan stitching was implemented during the design process. A grid configuration may apply scan stitching using physical-aware scan stitching or some other manner of scan stitching that prioritizes an efficient scan chain layout. Grid configuration scan stitching may provide stitching for efficient layouts for individual grid portions, groups of grid portions, and/or an entire profile of an SoC.

Figure 6:
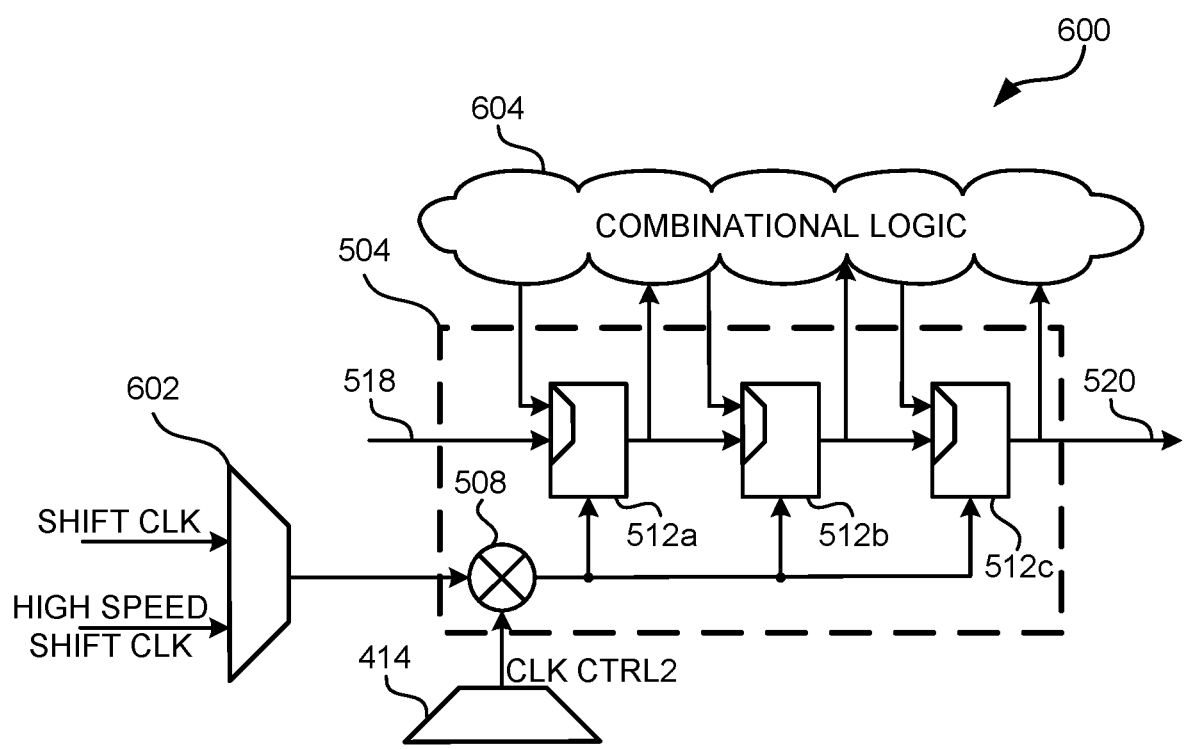
FIG. 6 illustrates a block diagram of a scan chain grid portion having flip flops for implementing various embodiments.

FIG. 6 illustrates a block diagram 600 of a scan chain grid portion 504 having flip flops 512a-c for implementing various embodiments. A series of flip flops sharing a same clock signal is referred to as a shift register. A flip flop, sometimes referred to as a latch, is a circuit implementing at least two logic gates to store state information. A group of logic gates may therefore be used to form one or more flip flops, such that each flip flop contains at least two logic gates. The flip flops 512a-c in FIG. 6 illustrate an example of a scan chain section, or grid portion 504 for use in testing combinational logic 604 in which the combinational logic is associated with functional circuitry of an SoC.

Taking the example described in FIG. 5, the grid portion 504 is represented as a block diagram. As previously described, implementing a grid configuration with grid-aware scan stitching may insert a series of flip flops associated with a grid portion in between a decompressor and a compressor. For example, a grid portion 504 may have flip flops 512a-c in which the flip flop 512a receives test data (e.g., scan_in) from the decompressor output 518, and the flip flop 512c output test data (e.g., scan_out) to the compressor input 520.

A multiplexor 602 may be used to toggle between a regular speed shift clock and a high-speed, or turbo, shift clock. The output of the multiplexor 602 may be conveyed to the clock gate 508. The clock gate controller 414 may configure the clock gate 508 to convey the clock signal from the multiplexor 602 to the flip flops 512a-c, as previously described. Once the flip flops 512a-c are activated (i.e. clocked), test data from the decompressor output can be shifted through the flip flops 512a-c at a rate defined by the frequency of the applied clock signal. More specifically, the output of the flip flop 512a is used as input to the flip flop 512b, and the output of the flip flop 512b is used as input to the flip flop 512c. The result is a shift register circuit that shifts a stored bit array one position at each transition of the clock signal provided through the multiplexor 602.

Combinational logic may be connected at the inputs and outputs of each of the flip flops 512a-c. Thus, the outputs of each flip flop in a grid-aware scan stitching configuration may become primary inputs to the combinational logic, and the inputs of each flip flop may allow registering the outputs of the combinational logic. This increases controllability of the combinational logic, such as through predefined or randomly generated test data, and increases observability as reported out to the compressor input 520.

The shift clock or high-speed shift clock conveyed to the clock gate 508 through the multiplexor 602 may be sourced or otherwise derived from a phase-locked loop. This allows for an increase in activity level exhibited by the flip flops and combination logic within a grid portion, which can increase the electrical and thermal responses observable and measurable at various portions of the grid for in-field monitoring and diagnostic purposes.

Figure 7:
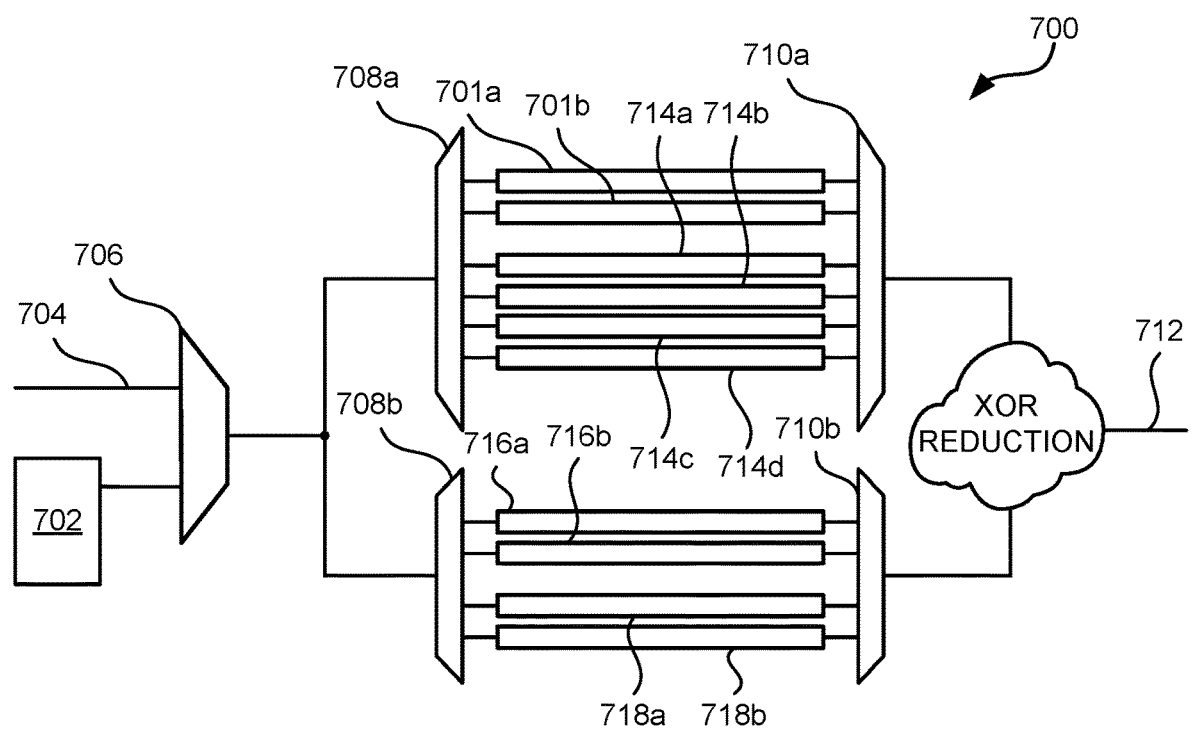
FIG. 7 illustrates a block diagram of multiple scan chain grid portions between decompressors and compressors for implementing various embodiments.

FIG. 7 illustrates a block diagram 700 of multiple scan chain grid portions between decompressors and compressors for implementing various embodiments. An SoC may include multiple decompressors and compressors for distributing test data throughout various scan chain and scan chain segments.

A multiplexor 706 may be used to convey either normal DFT data 704 (e.g., device scan_ins), or data from a pattern generator 702. The pattern generator 702 may be a pseudo-random pattern generator or any other specific pattern generator, such as a fixed pattern generator usable for generating test data for shift register testing. The pattern generator 702 may generate test data (e.g., thermal mode scan_in) suitable for in-field monitoring of thermal characteristics. In an example in which the pattern generator is a fixed pattern generator, a test pattern may be predefined as an alternating binary pattern (e.g., 101010 . . . etc.) to maximize the activity of the combinational logic circuitry.

A decompressor 708a may be used to convey the generated test data to one or more scan chains and/or scan chain segments. The decompressor 708a may decompress, and/or reiterate, the test data across scan chain multiple scan chains simultaneously. Referring to the example described in FIGS. 5 and 6, a grid portion 504 may include the flip flops 512a-c. As illustrated in FIG. 6, the shift register including flip flops 512a-512c positioned between the decompressor output 518 and the compressor input 520 may correspond to a single scan chain segment 701b. As another example, the grid portion 502 having flip flops 510a-510e coupled between the decompressor output 514 and the compressor input 516 may correspond to scan chain segment 701b. Thus, the decompressor 708a may simultaneously convey test data to multiple scan chain segments, and a compressor 710a may simultaneously compress the received test data into scan_out data 712 (i.e. after XOR reduction).

While FIG. 7 illustrates two scan chain segments 701a and 701b that correspond to grid portions 502 and 504, it is important to note that more scan chain segments may be implemented and therefore illustrated in which additional scan chain segments may correspond to additional grid portions of a scan chain layer. For example, a scan chain layer including scan chain segments 701a and 701b may include an additional scan chain segment corresponding to additional grid portions in which the additional scan chain segments would be illustrated as being inserted individually between the decompressor 708a and the compressor 710a. As another example, a different scan chain layer may be separated into a grid having four grid portions in which each grid portion corresponds to the scan chain segments 714a-714d.

In some embodiments, an SoC may include any number of decompressors and compressors, depending on the number of designed scan chains and scan chain segments corresponding to each scan chain. For example, test data may be input to decompressors 708a and 708b. In addition to the two scan chains having scan chain segments 701a and 701b, and scan chain segments 714a-714d, the decompressor 708b may include any number of scan chain segments corresponding to any number of scan chains and/or scan chain layers. For example, the SoC may have scan chain segments 716a and 716b corresponding to one scan chain grid configuration, and may also have scan chain segments 718a and 718b corresponding to another scan chain grid configuration. The scan chain segments 716a, 716b, 718a, and 718b may be inserted between the decompressor 708a and the compressor 710b during the grid-aware scan stitching design process. Each of the scan chain segments 716a, 716b, 718a, and 718b may be allocated a clock gate during the design process as previously described.

In some embodiments, multiple scan chain segments of one or more scan chains may be activated, or clocked, and therefore tested simultaneously. For example, because scan chain segment 714a may be part of a different grid configuration, and therefore a different grid-aware stitching configuration than scan chain segment 701a, testing an SoC may include activating both scan chain segments simultaneously to measure various thermal and electrical responses at other grid locations. This may reduce the overall testing duration in situations in which the scan chain segment 701a and 714a are in different physical locations (e.g., on different scan chain layers, at a different location within the SoC profile), such that the scan chain segment 701a is not proximate to scan chain segment 714a. Where activation of two or more segments may not interfere with measuring thermal characterizations attributed to each activated segment, simultaneous activation of one or more segments may reduce test time.

In some embodiments, multiple scan chain segments of one or more scan chains may be activated, or clocked, to provide increased power dispersed throughout the SoC for more rigorous testing. For example, two or more of the scan chain segments 701a, 701b, 714a-714d, 716a, 716b, 718a, and 718b may be activated simultaneously. This may be useful when characterizing portions of the SoC 322 that are associated with specific circuit functionality. For example, it may be desirable to activate and test scan chain segments 716a, 718b, and 701b if the corresponding combinational logic provides power supply control functionality or some other shared functionality. In some embodiments, all scan chain segments may be activated to execute "full load" testing, and in-field characteristics may be measured from all portions of the SoC.

Figure 8:
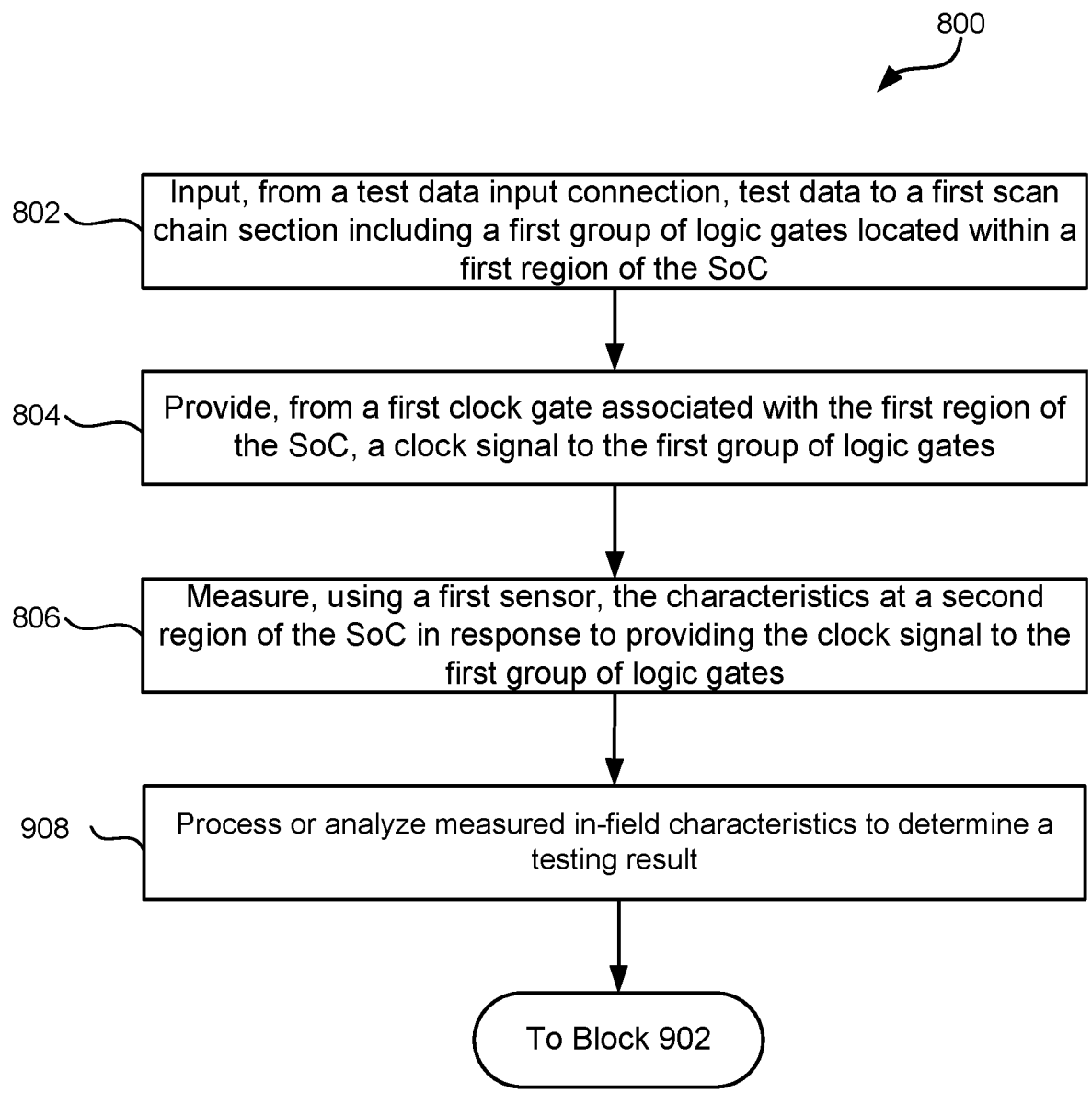
FIG. 8 is a process flow diagram illustrating an embodiment method of monitoring in-field characteristics of a system-on-a-chip according to various embodiments.

FIG. 8 is a process flow diagram illustrating an embodiment method 800 of monitoring characteristics of a system-on-a-chip according to various embodiments. With reference to FIGS. 1-8, the method 800 may be implemented in a processor (e.g., 14) that may be configured with processor-executable instruction stored in a non-transitory processor-readable medium (e.g., 16) to perform operations of the method. The order of operations performed in blocks 802-808 is merely illustrative, and the operations of blocks 802-808 may be performed in any order and partially simultaneously in various embodiments. In some embodiments, the method 800 may be performed by a processor independently from, but in conjunction with, the computing device 10. For example, the method 800 may be implemented as a software module executing within a processor (e.g., 14) of an SoC or in dedicated hardware within an SoC that monitors data and commands from/within the computing device 10 and is configured to take actions and store data as described. For ease of reference, the various elements performing the operations of the method 800 are referred to in the following method descriptions as a "processor."

In block 802, the processor may input test data from a test data input connection to a first scan chain section including a first group of logic gates located within a first region of the SoC. A flip flop, sometimes referred to as a latch, is a circuit implementing at least two logic gates to store state information. A group of logic gates may therefore be used to form one or more flip flops, such that each flip flop contains at least two logic gates. Groups of flip flops, as illustrated in FIG. 6, may be used to form a shift register that communicates directly with combinational logic of the SoC (e.g. 12). A shift register may be configured to shift test data sequentially through a group of serially connected flip flops. For a group of logic gates forming more than one flip flop, the test data may be received by a first flip flop in the shift register chain in which the output of the first flip flop is connected to the next flip flop in the shift register chain.

In some embodiments, logic gates of the first group of logic gates may be grouped based at least in part on physical-aware scan stitching. The flip flops associated with each set of logic gates may be spatially located within a physical profile of an SoC (e.g., 12) as described with reference to FIG. 3. Flip flops, and therefore logic gates, may be grouped manually, or algorithmically or through neural networks applying a set of rules or factors. The groupings of logic gates may be based in part on a shortest total scan chain distance. The grouping of logic gates may be stored in a memory (e.g., 16) and used for further design processing (e.g., grid-aware scan stitching) performed by the processor.

In some embodiments, the test data may be input to the first group of logic gates and any other group of logic gates simultaneously. The test data may be input from a scan chain layer of an SoC (e.g., 12). The scan chain layer may include one or more decompressors and one or more corresponding compressors to input test data into the first group of logic gates and any other group of logic gates in which the decompressors and compressors shift test data at the direction of the processor.

In some embodiments, the test data may be generated by a pattern generator coupled to the test data input connection. A pattern generator may be a component of the scan chain layer within an SoC (e.g., 12) that generates test data as instructed by the processor. The test data may be generated by a pattern generator, stored in a memory (e.g., 16), and later relayed to the decompressors for inputting the test data into the first group of logic gates and any other group of logic gates. The pattern generator may be a fixed pattern generator or a pseudo random pattern generator. In some embodiments, the logic gates of the first group of logic gates may be serially connected, and the test data may be serially shifted through the first group of logic gates.

In block 804, the processor may provide, from a first clock gate associated with the first region of the SoC, a clock signal to the first group of logic gates. The clock signal may be a clock signal generated by an SoC (e.g., 12), a computing device (e.g., 10) including the SoC, or through any other clock generating device capable of relaying a clock signal from externally to a communication component (e.g., 22) of a computing device. The clock signal may be a phase-locked loop clock signal. After configuring the first clock gate to relay the clock signal as illustrated in FIGS. 5 and 6, the clock signal can be used to activate the first group of logic gates such that test data can begin to be serially shifted into and through the first group of logic gates.

In some embodiments, the clock signal may be a high-speed clock or a turbo-shifted clock (e.g., turbo-shifted clock, 3.2 GHz clock). Shifting the test data input into each group of logic gates at high frequencies can cause an SoC (e.g., 12) to require high levels of power (e.g., higher levels of power than normal operation) to implement the combinational logic associated with each clocked flip flop as illustrated in FIG. 6. By increasing the power requirements for shifting data into the flip flops at high speeds, thermal and electrical responses produced at other sections of the SoC may be more readily measurable, and therefore any associated errors or attacks may be more easily identifiable. In some embodiments, the clock signal may be provided to the first clock gate from a clock gate controller, in which the clock gate controller is provided the clock signal (e.g., from a clock generator, crystal device, etc.).

In some embodiments, the first group of logic gates and the first clock gate may be spatially associated with the first scan chain section. A first scan chain section may correspond to a scan chain section, segment, or grid portion or region as illustrated in FIGS. 4 and 5. Grid-aware scan stitching of a scan chain layer may group the first group of logic gates from all other logic gates within an SoC (e.g., 12) into separate spatially identifiable grid portions or scan chain segments. The process of grouping the first set of logic gates may be performed by the processor, computing device (e.g., 10), or any other computing device implementing design process layout tools or applications. The logic gates associated with each grid region may be mapped and stored as a grid-aware scan chain layer within a memory (e.g., 16) for fabrication purposes (e.g., manufacturing of an SoC not used to develop the initial grid-aware scan stitching).

In some embodiments, the processor may configure the first clock gate to provide the clock signal to the first group of logic gates. As illustrated in FIGS. 5 and 6, a clock gate controller may be used to configure, or toggle, the status of the first clock gate. Configuring the first clock gate to convey the clock signal to the first group of logic gates may initiate shifting test data from the scan chain layer (e.g., pattern generator controlled by the processor) through the first group of logic gates.

In some embodiments, the status of the first clock gate may be stored in a memory (e.g., 16) to be communicated to the processor to determine which clock gates to configure. In some embodiments, the processor may issue commands to the clock gate controller to configure each clock gate within a scan chain layer of an SoC (e.g., 12) (i.e. to activate each group of logic gates sequentially by clock gating other groups of logic gates associated with different grid portions).

In block 806, the processor may cause a first sensor to measure the characteristics at the second region of the SoC in response to providing the clock signal to the first group of logic gates. In-field characteristics may be thermal and electrical characteristics exhibited by an SoC (e.g., 12) during in-field testing or operation. In some embodiments, electrical characteristics may include voltage drop and/or power grid characteristics. Such measurements may be in thermal and/or voltage sensors positioned throughout the SoC. In some embodiments, the additional measurements may be taken using sensors associated with other regions of the SoC in response to providing the clock signal to the first group of logic gates.

As described with reference to block 804, configuring the first clock gate to provide the clock signal to the first group of logic gates may initiate the shifting of test data through the first group of logic gates. Activating the first group of logic gates to apply test data to associated combination logic can cause thermal and electrical responses throughout other sections of an SoC. The characteristics, resulting from activation of and shifting of test data through the first group of flip flops in the first scan chain section, can be measured at the second region, which is a physical region of the SoC distinct from the first region, or any other definable region of the SoC.

In some embodiments, the in-field characteristics may be measured by temperature sensors and/or voltage sensors (e.g., 28) located within the second region. The temperature and voltage measurements measured by temperature and voltage sensors may be stored within memory (e.g., 16) for use in determining whether any errors or attacks have occurred or are likely to occur.

In block 808, the processor may process or analyze the measurements of in-field characteristics to determine a testing result. In-field testing of an SoC using various embodiment methods may be used to accomplish a variety of test objectives. For example, the in-field testing may be performed to monitor aging or degradation of performance of the SoC. As another example, the in-field testing may be performed to determine whether there any faults existing or likely within the SoC. As another example, the in-field testing may be performed to detect improper functionality or malware. Further, the in-field testing may be performed to measure and detect a combination of performance trends, current or likely faults, and improper functionality. For example, the processor may compare the characteristics against threshold values, in which the threshold values are associated with a particular condition, fault or improper functionality of the combination logic associated with the first scan chain section.

In some embodiments, a memory (e.g., 16) may store a number of predefined threshold values associated for each grid region of an SoC (e.g., 12). The threshold values may correspond to maximum and/or minimum values for in-field characteristics (e.g., temperature values, voltage drop, power grid characteristics, etc.) as measured at each grid portion in response to activating the logic gates of another grid portion. The first region may be attributed the same or different threshold values than the second region, depending on allowable tolerance levels, and SoC (e.g., 12) design layout. For example, the first region associated with first scan chain may exhibit higher thermal characteristics than the second region during normal operation, and may be associated with higher design threshold values for allowable operating temperature.

In some embodiments, the in-field characteristics measured by temperature and voltage sensors (e.g., sensors 28) at the first region and the second region may be stored in a memory (e.g., 16). A processor (e.g., 14) may compare the stored measured in-field characteristics against threshold values corresponding to each region associated with each scan chain section.

In some embodiments, the processor may identify an error in the SoC based on the comparison between the characteristics measured at the second region of the SoC threshold values associated with the second region of the SoC. If the measured in-field characteristics exceeded the threshold values, an error may be identified by the processor (e.g., 14). A memory (e.g., 16) may include a repository of identifiable errors or attacks based at least in part on which in-field characteristics exceeded the threshold values, by how much the threshold values were exceeded, and which scan chain section was at fault. Other factors may be considered when determining if an error can be identified as a potential issue within the SoC (e.g., aged power delivery network, increased IR drop values, on-chip or off-chip power attacks, hard errors, etc.).

In some embodiments, the processor may perform or otherwise implement a remedial action in response to identifying a fault, improper functionality or error. Depending on which, if any fault, improper functionality or error is identified, various remedial actions may be taken to prevent further damage or further security breach. For example, if the fault, improper functionality or error is related to power grid degradation, the processor may issue a command to an external computing device via a communication component (e.g., 22) to provide a notification to replace the SoC. As another example, if a power attack is identified, the processor may reboot, lock all functionality, or perform any other type of preventative measure against the present and future power attacks. In other examples, if a hard error is identified, the processor may issue a command to an external power grid to cycle power or cut off power to the computing device to issue a hard reset.

While FIG. 8 illustrates providing the clock signal and measuring in-field characteristics for just one scan chain section, the operations in blocks 802 through 808 may be performed for any number of scan chain sections within the SoC, and process or analyze the measured in-field characteristics for all scan chain sections in block 808 as described.

Figure 9:
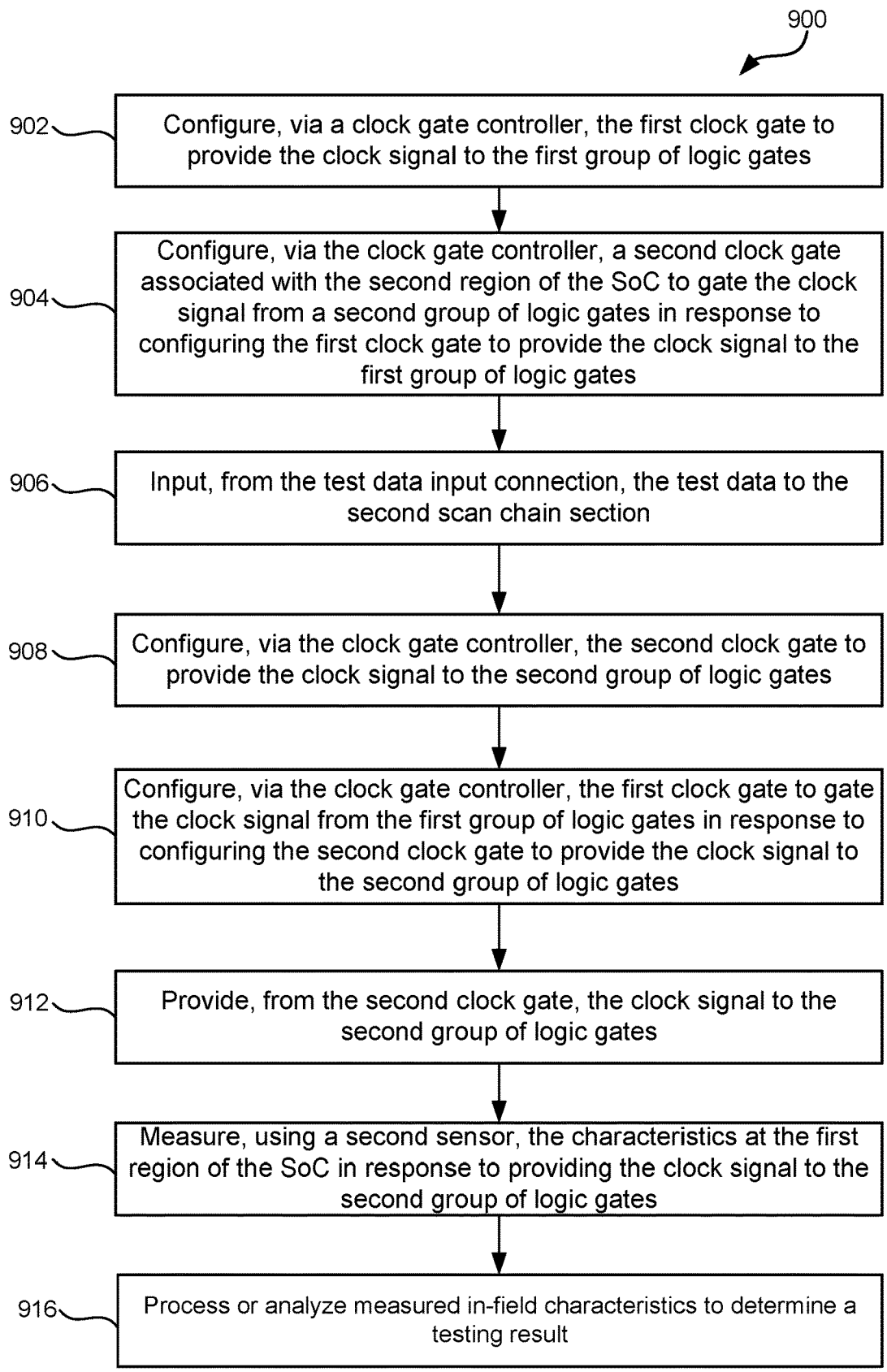
FIG. 9 is a process flow diagram illustrating an embodiment method of monitoring in-field characteristics of a system-on-a-chip including a second scan chain section according to various embodiments.

As noted above, various embodiments enable briefly activating individual grid portions while characteristic measurements (e.g., temperature, voltage, current, etc.) are obtained in other grid portions, and rapidly repeating this process for many or all individual grid portions so that measured characteristics are consistent on average with normal operations (in which many grids are activated) while enabling changes in measurements to be associated with particular one or few grid portions. FIG. 9 is a process flow diagram illustrating an embodiment method 900 of monitoring characteristics of a system-on-a-chip by sequentially activating the first scan chain and a second scan chain section while measuring characteristics according to various embodiments. While FIG. 9 illustrates the process through activation of just two scan chain sections, similar operations may be performed for the rest of the scan chains on an SoC.

With reference to FIGS. 1-9, the method 900 may be implemented in a processor (e.g., 14) that may be configured with processor-executable instruction stored in a non-transitory processor-readable medium (e.g., 16) to perform operations of the method. The order of operations performed in blocks 902-916 is merely illustrative, and the operations of blocks 902-916 may be performed in any order and partially simultaneously in various embodiments. In some embodiments, the operations of blocks 902-916 may be performed in any order and partially simultaneously with respect to blocks 802-808 of FIG. 8. In some embodiments, the method 900 may be performed by a processor independently from, but in conjunction with, the computing device 10. For example, the method 900 may be implemented as a software module executing within a processor (e.g., 14) of an SoC or in dedicated hardware within an SoC that monitors data and commands from/within the computing device 10 and is configured to take actions and store data as described. For ease of reference, the various elements performing the operations of the method 900 are referred to in the following method descriptions as a "processor."

In block 902, the processor may configure, via a clock gate controller, the first clock gate to provide the clock signal to the first group of logic gates. As illustrated in FIGS. 5 and 6, a clock gate controller may be used to configure, or toggle, the status of the first clock gate. Configuring the first clock gate to convey the clock signal to the first group of logic gates may initiate shifting test data from the scan chain layer (e.g., pattern generator controlled by the processor) through the first group of logic gates.

In block 904, the processor may configure, via the clock gate controller, a second clock gate associated with the second region of the SoC to gate the clock signal from a second group of logic gates in response to configuring the first clock gate to provide the clock signal to the first group of logic gates. By gating the clock to the second group of logic gates in response to the processes described in block 902, the first clock gate may provide the clock signal to the first group of logic gates while preventing the clock signal from being provided to the second group of logic gates. Thus, the combinational logic connected to the first group of logic gates may be activated while the combinational logic connected to the second group of logic gates can remain inactive. This may allow for the testing of specific regions of the SoC, via measurements taken throughout the SoC, such that measurements are the result of a specific scan chain section corresponding to associated combinational logic.

In block 906, the processor may input, from the test data input connection, test data to a second scan chain section. The second scan chain section includes a second group of logic gates located within the second region of the SoC. A flip flop, sometimes referred to as a latch, is a circuit implementing at least two logic gates to store state information. A group of logic gates may therefore be used to form one or more flip flops, such that each flip flop contains at least two logic gates. Groups of flip flops, as illustrated in FIG. 6, may be used to form a shift register that communicates directly with combinational logic of the SoC (e.g. 12). A shift register may be configured to shift test data sequentially through a group of serially connected flip flops. For a group of logic gates forming more than one flip flop, the test data may be received by a first flip flop in the shift register chain in which the output of the first flip flop is connected to the next flip flop in the shift register chain.

In some embodiments, logic gates of the second group of logic gates may be grouped based at least in part on physical-aware scan stitching. The flip flops associated with each set of logic gates may be spatially located within a physical profile of an SoC (e.g., 12) as described with reference to FIG. 3. Flip flops, and therefore logic gates, may be grouped manually, or algorithmically or through neural networks applying a set of rules or factors. The groupings of logic gates may be based in part on a shortest total scan chain distance. The grouping of logic gates may be stored in a memory (e.g., 16) and used for further design processing (e.g., grid-aware scan stitching) performed by the processor.

In some embodiments, the test data may be input to the second group of logic gates and any other group of logic gates simultaneously. The test data may be input from a scan chain layer of an SoC (e.g., 12). The scan chain layer may include one or more decompressors and one or more corresponding compressors to input test data into the second group of logic gates and any other group of logic gates in which the decompressors and compressors shift test data at the direction of the processor.

In some embodiments, the test data may be generated by a pattern generator coupled to the test data input connection. A pattern generator may be a component of the scan chain layer within an SoC (e.g., 12) that generates test data as instructed by the processor. The test data may be generated by a pattern generator, stored in a memory (e.g., 16), and later relayed to the decompressors for inputting the test data into the first group of logic gates, the second group of logic gates, and any other group of logic gates. The pattern generator may be a fixed pattern generator or a pseudo random pattern generator. In some embodiments, the logic gates of the second group of logic gates may be serially connected, and the test data may be serially shifted through the second group of logic gates.

In block 908, the processor may configure, via the clock gate controller, the second clock gate to provide the clock signal to the second group of logic gates. As illustrated in FIGS. 5 and 6, a clock gate controller may be used to configure, or toggle, the status of the second clock gate. Configuring the second clock gate to convey the clock signal to the second group of logic gates may initiate shifting test data from the scan chain layer (e.g., pattern generator controlled by the processor) through the second group of logic gates.

In some embodiments, the status of each clock gate (e.g., the first clock gate, the second clock gate, any other clock gate within the SoC) may be stored in a memory (e.g., 16) to be communicated to the processor to determine which clock gates to configure. In some embodiments, the processor may issue commands to the clock gate controller to configure each clock gate within a scan chain layer of an SoC (e.g., 12) (i.e. to activate the first set of logic gates and the second set of logic gates sequentially by clock gating the second clock gate and the first clock gate respectively).

In block 910, the processor may configure, via the clock gate controller, the first clock gate to gate the clock signal from the first group of logic gates in response to configuring the second clock gate to provide the clock signal to the second group of logic gates. By gating the clock to the first group of logic gates in response to the processes described in block 908, the second clock gate provides the clock signal to the second group of logic gates while preventing the clock signal from being provided to the first group of logic gates. Thus, the combinational logic connected to the second group of logic gates may be activated while the combinational logic connected to the first group of logic gates can remain inactive. This may allow for the testing of specific regions of the SoC, via measurements taken throughout the SoC, such that measurements are the result of a specific scan chain section corresponding to associated combinational logic.

In block 912, the processor may provide, from the second clock gate, the clock signal to the second group of logic gates. The clock signal may be a clock signal generated by an SoC (e.g., 12), a computing device (e.g., 10) including the SoC, or through any other clock generating device capable of relaying a clock signal from externally to a communication component (e.g., 22) of a computing device. The clock signal may be a phase-locked loop clock signal. After configuring the second clock gate to relay the clock signal as illustrated in FIGS. 5 and 6, the clock signal may be used to activate the second group of logic gates, such that test data can begin to be serially shifted into and through the second group of logic gates.

In some embodiments, the clock signal may be a high-speed clock or a turbo-shifted clock (e.g., turbo-shifted clock, 3.2 GHz clock). Shifting the test data input into each group of logic gates at high frequencies can cause an SoC (e.g., 12) to achieve high levels of power during in-service testing (e.g., higher levels of power than normal operation) to implement the combinational logic associated with each clocked flip flop as illustrated in FIG. 6. By increasing the power requirements for shifting data into the flip flops at high speeds, thermal and electrical responses produced at other sections of the SoC may be more readily measurable, and therefore any associated errors or attacks may be more easily identifiable while enabling a source or sources of such issues to be localized to particular scan chain sections. In some embodiments, the clock signal may be provided to the first clock gate and the second clock gate from a clock gate controller, in which the clock gate controller is provided the clock signal (e.g., from a clock generator, crystal device, etc.).

In some embodiments, the second group of logic gates and the second clock gate may be spatially associated with the second scan chain section. A second scan chain section may correspond to a scan chain section, segment, or grid portion or region as illustrated in FIGS. 4 and 5. Grid-aware scan stitching of a scan chain layer may group the second group of logic gates from all other logic gates (including the first group of logic gates) within an SoC (e.g., 12) into separate spatially identifiable grid regions corresponding to separate scan chain segments. The process of grouping the second set of logic gates may be performed by the processor, computing device (e.g., 10), or any other computing device implementing design process layout tools or applications. The logic gates associated with each grid portion may be mapped and stored as a grid-aware scan chain layer within a memory (e.g., 16) for fabrication purposes (e.g., manufacturing of an SoC not used to develop the initial grid-aware scan stitching). In some embodiments, the first region of the SoC and the second region of the SoC may be logically arranged in a grid configuration with a plurality of scan chain sections corresponding to a plurality of regions of the SoC.

The second scan chain section may be an SoC portion, region, or area distinct from another SoC portion, region, or area including the second scan chain section, such that the first group of logic gates and the second group of logic gates are located within different physical regions of the SoC (e.g., 12) layout.

In block 914, the processor may cause a second sensor to measure the characteristics at the first region of the SoC in response to providing the clock signal to the second group of logic gates. In-field characteristics may be thermal and electrical characteristics exhibited by an SoC (e.g., 12) during in-field testing or operation. In some embodiments, electrical characteristics may include voltage drop and/or power grid characteristics. Such measurements may be in thermal and/or voltage sensors positioned throughout the SoC. In some embodiments, the additional measurements may be taken using sensors associated with other regions of the SoC in response to providing the clock signal to the second group of logic gates.

As described with reference to block 908, configuring the second clock gate to provide the clock signal to the second group of logic gates may initiate the shifting of test data through the second group of logic gates. Activating the second group of logic gates to apply test data to associated combination logic can cause thermal and electrical responses throughout other sections of an SoC. The characteristics, resulting from activation of and shifting of test data through the second group of flip flops in the second scan chain section, can be measured at the first region, which is a physical region of the SoC distinct from the first region, or any other definable region of the SoC.

In some embodiments, the in-field characteristics may be measured by temperature sensors and/or voltage sensors (e.g., 28) located within the first region or any other region. The temperature and voltage measurements measured by temperature and voltage sensors may be stored within memory (e.g., 16) for use in determining whether any errors or attacks have occurred or are likely to occur. In some embodiments, the first sensor and the second sensors may be temperature and/or voltage sensors in which the measured characteristics are temperatures of and/or voltages in respective regions of the SoC.

In block 916, the processor may process or analyze the measurements of in-field characteristics to determine a testing result. In-field testing of an SoC using various embodiment methods may be used to accomplish a variety of test objectives. For example, the in-field testing may be performed to monitor aging or degradation of performance of the SoC. As another example, the in-field testing may be performed to determine whether there are any faults existing or likely within the SoC. As another example, the in-field testing may be performed to detect improper functionality or malware. Further, the in-field testing may be performed to measure and detect a combination of performance trends, current or likely faults, and improper functionality. For example, the processor may compare the characteristics measured by the first sensor against threshold values associated with the second region, and/or may compare the characteristics measured by the second sensor against threshold values associated with the first region, in which the threshold values are associated with a particular condition, fault or improper functionality of the combination logic associated with the first scan chain section and/or second scan chain section.

In some embodiments, a memory (e.g., 16) may store a number of predefined threshold values associated for each grid region of an SoC (e.g., 12). The threshold values may correspond to maximum and/or minimum values for in-field characteristics (e.g., temperature values, voltage drop, power grid characteristics, etc.) as measured at each grid portion in response to activating the logic gates of another grid portion. The first region may be attributed the same or different threshold values than the second region, depending on allowable tolerance levels, and SoC (e.g., 12) design layout. For example, the first region associated with first scan chain may exhibit higher thermal characteristics than the second region during normal operation, and may be associated with higher design threshold values for allowable operating temperature.

In some embodiments, the in-field characteristics measured by temperature and voltage sensors (e.g., sensors 28) at the first region and the second region may be stored in a memory (e.g., 16). A processor (e.g., 14) may compare the stored measured in-field characteristics against threshold values corresponding to each region associated with each scan chain section.

In some embodiments, the processor may identify an error in the SoC based on the comparison between the characteristics measured at the second region of the SoC threshold values associated with the second region of the SoC. If the measured in-field characteristics exceeded the threshold values, an error may be identified by the processor (e.g., 14). A memory (e.g., 16) may include a repository of identifiable errors or attacks based at least in part on which in-field characteristics exceeded the threshold values, by how much the threshold values were exceeded, and which scan chain section was at fault. Other factors may be considered when determining if an error can be identified as a potential issue within the SoC (e.g., aged power delivery network, increased IR drop values, on-chip or off-chip power attacks, hard errors, etc.).

In some embodiments, the processor may perform or otherwise implement a remedial action in response to identifying a fault, improper functionality or error. Depending on which, if any fault, improper functionality or error is identified, various remedial actions may be taken to prevent further damage or further security breach. For example, if the fault, improper functionality or error is related to power grid degradation, the processor may issue a command to an external computing device via a communication component (e.g., 22) to provide a notification to replace the SoC. As another example, if a power attack is identified, the processor may reboot, lock all functionality, or perform any other type of preventative measure against the present and future power attacks. In other examples, if a hard error is identified, the processor may issue a command to an external power grid to cycle power or cut off power to the computing device to issue a hard reset.

While FIG. 9 illustrates providing the clock signal and measuring in-field characteristics for just two scan chain sections, the operations in blocks 902 through 916 may be performed for any number of scan chain sections within the SoC, and process or analyze the measured in-field characteristics for all scan chain sections in block 916 as described.

Figure 10:
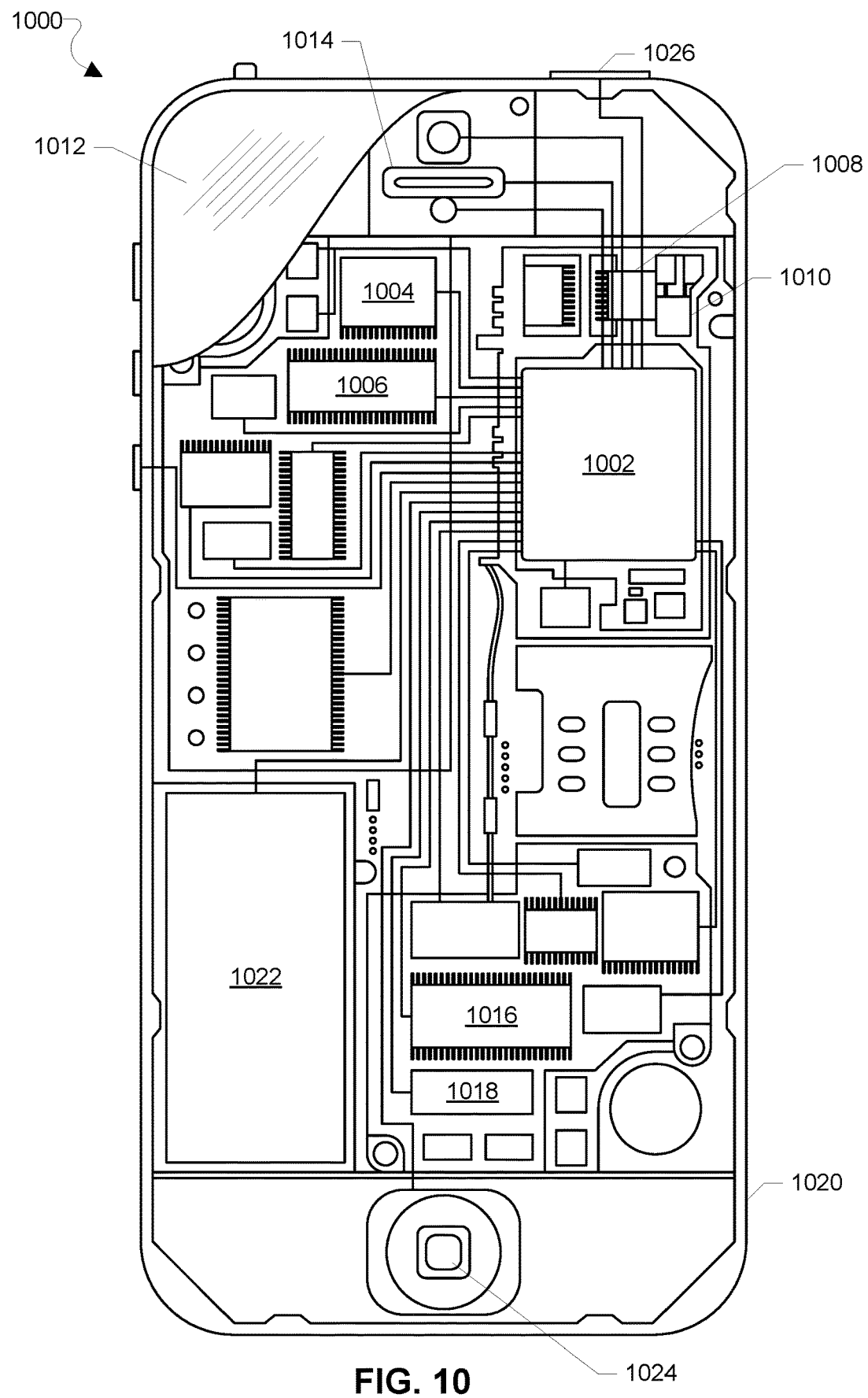
FIG. 10 is a component block diagram illustrating an example wireless communication device suitable for use with the various embodiments.

The various embodiments (including, but not limited to, embodiments described above with reference to FIGS. 1-9) may be implemented in a wide variety of computing systems including automotive vehicles or other mobile computing devices, an example of which suitable for use with the various embodiments is illustrated in FIG. 10. With reference to FIGS. 1-10, a mobile computing device 1000 may include a processor 1002 coupled to a touchscreen controller 1004 and an internal memory 1006. The processor 1002 may be one or more multicore integrated circuits designated for general or specific processing tasks. The internal memory 1006 may be volatile or non-volatile memory, and may also be secure and/or encrypted memory, or unsecure and/or unencrypted memory, or any combination thereof. Examples of memory types that may be leveraged include but are not limited to DDR, LPDDR, GDDR, WIDEIO, RAM, SRAM, DRAM, P-RAM, R-RAM, M-RAM, STT-RAM, and embedded DRAM. The touchscreen controller 1004 and the processor 1002 may also be coupled to a touchscreen panel 1012, such as a resistive-sensing touchscreen, capacitive-sensing touchscreen, infrared sensing touchscreen, etc. Additionally, the display of the mobile computing device 1000 need not have touch screen capability.

The mobile computing device 1000 may have one or more radio signal transceivers 1008 (e.g., Peanut, Bluetooth, ZigBee, Wi-Fi, RF radio) and antennae 1010, for sending and receiving communications, coupled to each other and/or to the processor 1002. The transceivers 1008 and antennae 1010 may be used with the above-mentioned circuitry to implement the various wireless transmission protocol stacks and interfaces. The mobile computing device 1000 may include a cellular network wireless modem chip 1016 that enables communication via a cellular network and is coupled to the processor.

The mobile computing device 1000 may include a peripheral device connection interface 1018 coupled to the processor 1002. The peripheral device connection interface 1018 may be singularly configured to accept one type of connection, or may be configured to accept various types of physical and communication connections, common or proprietary, such as Universal Serial Bus (USB), FireWire, Thunderbolt, or PCIe. The peripheral device connection interface 1018 may also be coupled to a similarly configured peripheral device connection port (not shown).

The mobile computing device 1000 may also include speakers 1014 for providing audio outputs. The mobile computing device 1000 may also include a housing 1020, constructed of a plastic, metal, or a combination of materials, for containing all or some of the components described herein. The mobile computing device 1000 may include a power source 1022 coupled to the processor 1002, such as a disposable or rechargeable battery. The rechargeable battery may also be coupled to the peripheral device connection port to receive a charging current from a source external to the mobile computing device 1000. The mobile computing device 1000 may also include a physical button 1024 for receiving user inputs. The mobile computing device 1000 may also include a power button 1026 for turning the mobile computing device 1000 on and off.

Figure 11:
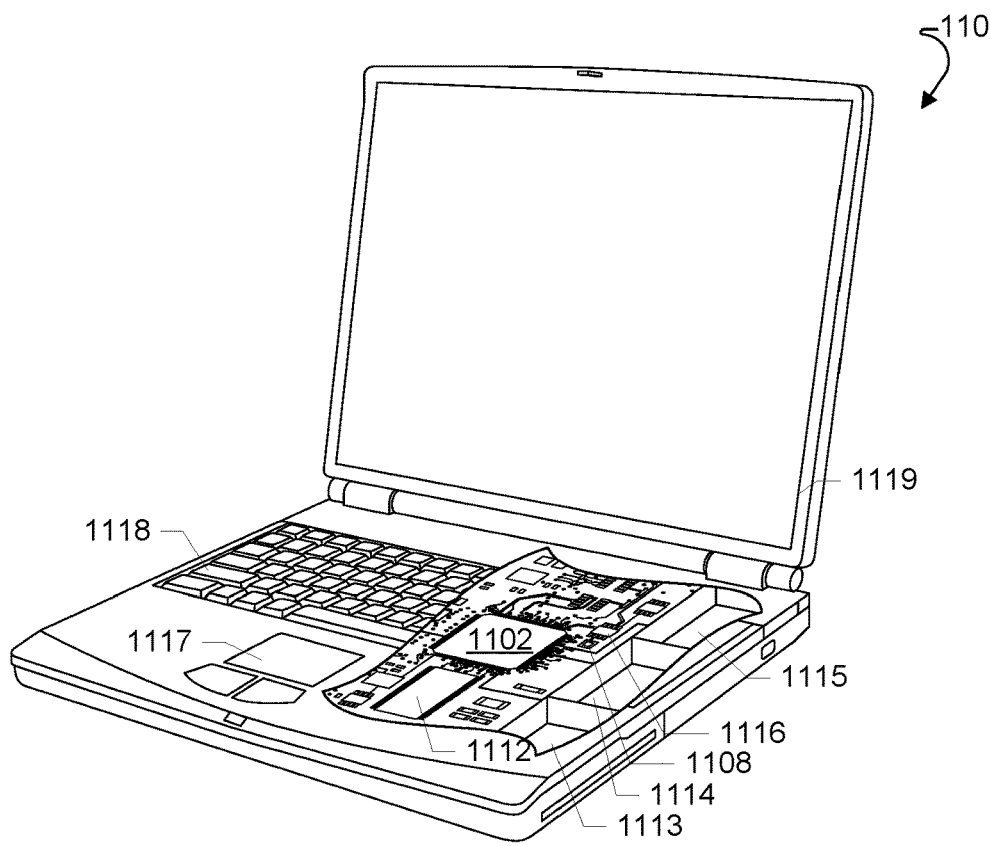
FIG. 11 is a component block diagram illustrating an example computing device suitable for use with the various embodiments.

The various embodiments (including, but not limited to, embodiments described above with reference to FIGS. 1-9) may be implemented in a wide variety of computing systems include a laptop computer 1100 an example of which is illustrated in FIG. 11. With reference to FIGS. 1-11, a laptop computer may include a touchpad touch surface 1117 that serves as the computer's pointing device, and thus may receive drag, scroll, and flick gestures similar to those implemented on computing devices equipped with a touch screen display and described above. A laptop computer 1100 will typically include a processor 1102 coupled to volatile memory 1112 and a large capacity nonvolatile memory, such as a disk drive 1113 of Flash memory. Additionally, the computer 1100 may have one or more antenna 1108 for sending and receiving electromagnetic radiation that may be connected to a wireless data link and/or cellular telephone transceiver 1116 coupled to the processor 1102. The computer 1100 may also include a floppy disc drive 1114 and a compact disc (CD) drive 1115 coupled to the processor 1102. The laptop computer 1100 may include a touchpad 1117, a keyboard 1118, and a display 1119 all coupled to the processor 1102. Other configurations of the computing device may include a computer mouse or trackball coupled to the processor (e.g., via a USB input) as are well known, which may also be used in conjunction with the various embodiments.

Figure 12:
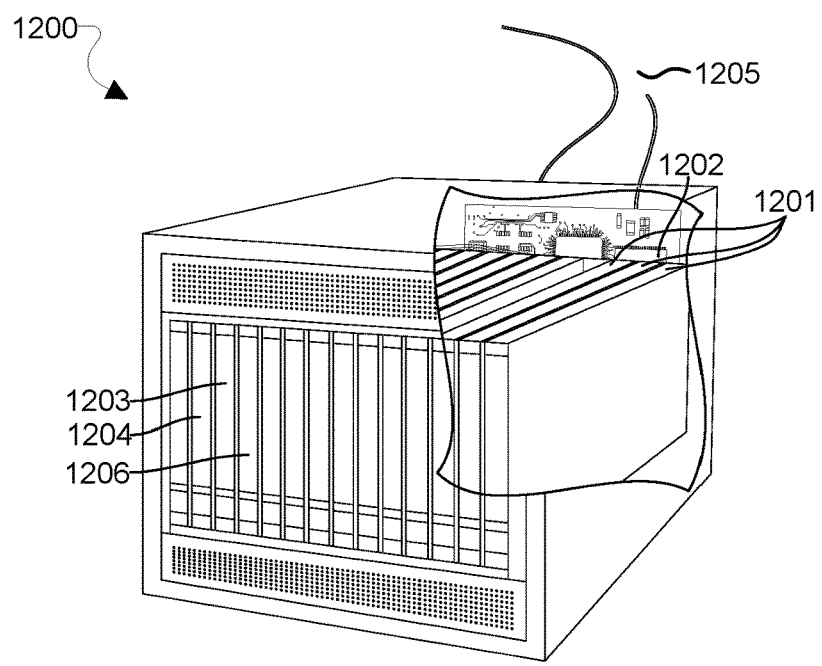
FIG. 12 is a component block diagram illustrating an example server suitable for use with the various embodiments.

The various embodiments (including, but not limited to, embodiments described above with reference to FIGS. 1-9) may also be implemented in fixed computing systems, such as any of a variety of commercially available servers. With reference to FIGS. 1-12, an example server 1200 is illustrated in FIG. 12. Such a server 1200 typically includes one or more multicore processor assemblies 1201 coupled to volatile memory 1202 and a large capacity nonvolatile memory, such as a disk drive 1204. As illustrated in FIG. 12, multicore processor assemblies 1201 may be added to the server 1200 by inserting them into the racks of the assembly. The server 1200 may also include a floppy disc drive, compact disc (CD) or digital versatile disc (DVD) disc drive 1206 coupled to the processor 1201. The server 1200 may also include network access ports 1203 coupled to the multicore processor assemblies 1201 for establishing network interface connections with a network 1205, such as a local area network coupled to other broadcast system computers and servers, the Internet, the public switched telephone network, and/or a cellular data network (e.g., CDMA, TDMA, GSM, PCS, 3G, 4G, LTE, or any other type of cellular data network).

Computer program code or "program code" for execution on a programmable processor for carrying out operations of the various embodiments may be written in a high level programming language such as C, C++, C#, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

Various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

The foregoing method descriptions and the process flow diagrams are provided merely as illustrative examples and are not intended to require or imply that the blocks of various embodiments must be performed in the order presented. As will be appreciated by one of skill in the art the order of blocks in the foregoing embodiments may be performed in any order. Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm blocks described in connection with the embodiments disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such embodiment decisions should not be interpreted as causing a departure from the scope of various embodiments.

The hardware used to implement the various illustrative logics, logical blocks, modules, and circuits described in connection with the embodiments disclosed herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of communication devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In various embodiments, the functions described may be implemented in hardware, software, firmware, or any combination thereof. If implemented in software, the functions may be stored as one or more instructions or code on a non-transitory computer-readable medium or non-transitory processor-readable medium. The operations of a method or algorithm disclosed herein may be embodied in a processor-executable software module, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present embodiments. Various modifications to these embodiments will be readily apparent to those skilled in the art, and the generic principles defined herein may be applied to other embodiments without departing from the scope of the embodiments. Thus, various embodiments are not intended to be limited to the embodiments shown herein but are to be accorded the widest scope consistent with the following claims and the principles and novel features disclosed herein.

What is claimed is:

1. A system-on-a-chip (SoC) configured for monitoring characteristics, comprising:

a first scan chain section including a first group of logic gates located within a first grid portion of the SoC;

a first clock gate configurable to provide a clock signal to the first group of logic gates, wherein the first clock gate is associated with the first grid portion;

a second clock gate configurable to provide the clock signal to a second group of logic gates, wherein the second clock gate is associated with a second grid portion;

a test data input connection configured to input test data to the first scan chain section;

a clock gate controller configured to control the first clock gate to provide the clock signal to the first group of logic gates while controlling the second clock gate to gate the clock signal from the second group of logic gates, and to control the second clock gate to provide the clock signal to the second group of logic gates while controlling the first clock gate to gate the clock signal from the first group of logic gates; and a first sensor located within the second grid portion configured to measure the characteristics at the second grid portion of the SoC in response to the clock signal provided to the first group of logic gates.

2. The SoC of claim 1, further comprising:

a second scan chain section including the second group of logic gates located within the second grid portion of the SoC; and a second sensor configured to measure the characteristics at the first grid portion of the SoC, wherein the test data input connection is configured to input the test data to the second scan chain section, and wherein the second sensor is configured to measure the characteristics at the first grid portion in response to the clock signal provided to the second group of logic gates.

3. The SoC of claim 2, wherein the first and second sensors are temperature sensors and the characteristics are temperatures of the respective grid portion.

4. The SoC of claim 2, wherein the first and second sensors are voltage sensors and the characteristics are voltages in the respective grid portion.

5. The SoC of claim 2, wherein the SoC is configured to:

compare characteristics measurements by the first and second sensors to a threshold corresponding to the respective grid portion;

identify an error in the SoC in response to a measured characteristic exceeding the threshold; and implement a remedial action in response to identifying the error.

6. The SoC of claim 5, wherein the error is an indication of an aged power delivery network, an on-chip or off-chip power attack, or a hard-error.

7. The SoC of claim 2, wherein the characteristics include thermal characteristics, voltage drop, and power grid characteristics.

8. The SoC of claim 2, wherein logic gates of the first group of logic gates are serially connected, wherein logic gates of the second group of logic gates are serially connected, and wherein the test data is input into the first and second scan chain sections by serially shifting the test data through the first and second groups of logic gates.

9. The SoC of claim 2, further comprising a pattern generator coupled to the test data input connection and configured to generate the test data input to the first and second scan chain sections.

10. The SoC of claim 2, wherein the clock gate controller is provided a high-speed clock or a turbo-shifted clock.

11. The SoC of claim 2, wherein the first grid portion and the second grid portion are logically arranged in a grid configuration with a plurality of scan chain sections corresponding to a plurality of grid portions of the SoC.

12. A method for monitoring characteristics of a system-on-a-chip (SoC), comprising:

inputting, from a test data input connection, test data to a first scan chain section including a first group of logic gates located within a first grid portion of the SoC;

configuring, via a clock gate controller, a first clock gate to provide the clock signal to the first group of logic gates;

configuring, via the clock gate controller, a second clock gate associated with a second grid portion of the SoC to gate the clock signal from a second group of logic gates in response to configuring the first clock gate to provide the clock signal to the first group of logic gates;

providing, from the first clock gate associated with the first grid portion of the SoC, a clock signal to the first group of logic gates; and measuring, using a first sensor, characteristics at a second grid portion of the SoC in response to providing the clock signal to the first group of logic gates.

13. The method of claim 12, further comprising:

inputting, from the test data input connection, the test data to a second scan chain section, wherein the second scan chain section includes the second group of logic gates located within the second grid portion of the SoC;

configuring, via the clock gate controller, the second clock gate to provide the clock signal to the second group of logic gates;

configuring, via the clock gate controller, the first clock gate to gate the clock signal from the first group of logic gates in response to configuring the second clock gate to provide the clock signal to the second group of logic gates;

providing, from the second clock gate, the clock signal to the second group of logic gates; and measuring, using a second sensor, the characteristics at the first grid portion of the SoC in response to providing the clock signal to the second group of logic gates.

14. The method of claim 13, wherein the first and second sensors are temperature sensors and the characteristics are temperatures of the respective grid portion.

15. The method of claim 13, wherein the first and second sensors are voltage sensors and the characteristics are voltages in the respective grid portion.

16. The method of claim 13, further comprising:

comparing the characteristics measurements by the first and second sensors to a threshold corresponding to the respective grid portion;

identifying an error in the SoC in response to a measured characteristic exceeding the threshold, wherein the error is an indication of an aged power delivery network, an on-chip or off-chip power attack, or a hard-error; and implementing a remedial action in response to identifying the error.

17. The method of claim 13, further comprising:

generating, by a pattern generator coupled to the test data input connection, the test data input to the first and second scan chain sections, wherein logic gates of the first group of logic gates are serially connected, wherein logic gates of the second group of logic gates are serially connected, and wherein the inputting the test data into the first and second scan chain sections further comprises serially shifting the test data through the first and second groups of logic gates.

18. The method of claim 13, wherein the clock gate controller is provided a high-speed clock or a turbo-shifted clock.

19. The method of claim 13, wherein the first grid portion and the second grid portion are logically arranged in a grid configuration with a plurality of scan chain sections corresponding to a plurality of grid portions of the SoC.

20. A non-transitory processor-readable medium having stored thereon processor-executable instructions configured to cause a processor of a system-on-a-chip (SoC) to perform operations for monitoring in-field characteristics comprising:

inputting, from a test data input connection, test data to a first scan chain section including a first group of logic gates located within a first grid portion of the SoC;

configuring, via a clock gate controller, a first clock gate to provide the clock signal to the first group of logic gates;

configuring, via the clock gate controller, a second clock gate associated with a second grid portion of the SoC to gate the clock signal from a second group of logic gates in response to configuring the first clock gate to provide the clock signal to the first group of logic gates;

providing, from the first clock gate associated with the first grid portion of the SoC, a clock signal to the first group of logic gates; and measuring, using a first sensor, the characteristics at a second grid portion of the SoC in response to providing the clock signal to the first group of logic gates.

21. The non-transitory processor-readable medium of claim 20, wherein the stored processor-executable instructions are configured to cause the processor to perform operations further comprising:

inputting, from the test data input connection, the test data to a second scan chain section, wherein a second scan chain section includes the second group of logic gates located within the second grid portion of the SoC;

configuring, via the clock gate controller, the second clock gate to provide the clock signal to the second group of logic gates;

configuring, via the clock gate controller, the first clock gate to gate the clock signal from the first group of logic gates in response to configuring the second clock gate to provide the clock signal to the second group of logic gates;

providing, from the second clock gate, the clock signal to the second group of logic gates; and measuring, using a second sensor, the characteristics at the first grid portion of the SoC in response to providing the clock signal to the second group of logic gates.

22. The non-transitory processor-readable medium of claim 21, wherein the first and second sensors are temperature sensors and voltage sensors and the characteristics are temperatures of the respective grid portion and voltages in the respective grid portion.

23. The non-transitory processor-readable medium of claim 21, wherein the stored processor-executable instructions are configured to cause the processor to perform operations further comprising:

comparing the characteristics measurements by the first and second sensors to a threshold corresponding to the respective grid portion;

identifying an error in the SoC in response to a measured characteristic exceeding the threshold, wherein the error is an indication of an aged power delivery network, an on-chip or off-chip power attack, or a hard-error; and implementing a remedial action in response to identifying the error.

24. The non-transitory processor-readable medium of claim 21, wherein the stored processor-executable instructions are configured to cause the processor to perform operations further comprising:

generating, by a pattern generator coupled to the test data input connection, the test data input to the first and second scan chain sections, wherein logic gates of the first group of logic gates are serially connected, wherein logic gates of the second group of logic gates are serially connected, and wherein the inputting the test data into the first and second scan chain sections further comprises serially shifting the test data through the first and second groups of logic gates.

25. The non-transitory processor-readable medium of claim 21, wherein the clock gate controller is provided a high-speed clock or a turbo-shifted clock.

26. The non-transitory processor-readable medium of claim 21, wherein the first grid portion and the second grid portion are logically arranged in a grid configuration with a plurality of scan chain sections corresponding to a plurality of grid portion of the SoC.

27. A system-on-a-chip, comprising:

means for inputting, from a test data input connection, test data to a first scan chain section including a first group of logic gates located within a first grid portion of the SoC;

means for configuring, via a clock gate controller, a first clock gate to provide the clock signal to the first group of logic gates;

means for configuring, via the clock gate controller, a second clock gate associated with a second grid portion of the SoC to gate the clock signal from a second group of logic gates in response to configuring the first clock gate to provide the clock signal to the first group of logic gates;

means for providing, from the first clock gate associated with the first grid portion of the SoC, a clock signal to the first group of logic gates; and means for measuring, using a first sensor, characteristics at a second grid portion of the SoC in response to providing the clock signal to the first group of logic gates.

28. The system-on-a-chip of claim 27, further comprising:

means for inputting, from the test data input connection, the test data to a second scan chain section, wherein the second scan chain section includes the second group of logic gates located within the second grid portion of the SoC;

means for configuring, via the clock gate controller, the second clock gate to provide the clock signal to the second group of logic gates;

means for configuring, via the clock gate controller, the first clock gate to gate the clock signal from the first group of logic gates in response to configuring the second clock gate to provide the clock signal to the second group of logic gates;

means for providing, from the second clock gate, the clock signal to the second group of logic gates; and means for measuring, using a second sensor, the characteristics at the first grid portion of the SoC in response to providing the clock signal to the second group of logic gates.

29. The system-on-a-chip of claim 28, wherein the first and second sensors are temperature sensors and voltage sensors and the characteristics are temperatures of the respective grid portion and voltages in the respective grid portion.

30. The system-on-a-chip of claim 28, further comprising:

means for comparing the characteristics measurements by the first and second sensors to a threshold corresponding to the respective grid portion;

means for identifying an error in the SoC in response to a measured characteristic exceeding the threshold, wherein the error is an indication of an aged power delivery network, an on-chip or off-chip power attack, or a hard-error; and means for implementing a remedial action in response to identifying the error.

* * * * *